United States Patent [19]
Irie et al.

[11] Patent Number: 5,596,204
[45] Date of Patent: Jan. 21, 1997

[54] METHOD FOR ALIGNING PROCESSING AREAS ON A SUBSTRATE WITH A PREDETERMINED POSITION IN A STATIC COORDINATE SYSTEM

[75] Inventors: Nobuyuki Irie, Kawasaki; Shigeru Hirukawa, Kashiwa; Hiroki Tateno, Kawasaki, all of Japan

[73] Assignee: Nikon Corporation, Tokyo, Japan

[21] Appl. No.: 222,868

[22] Filed: Apr. 5, 1994

[30] Foreign Application Priority Data

| Apr. 6, 1993 | [JP] | Japan | 5-079414 |
| Apr. 27, 1993 | [JP] | Japan | 5-100622 |
| Jun. 7, 1993 | [JP] | Japan | 5-135968 |

[51] Int. Cl.⁶ ............................................. G01N 21/86
[52] U.S. Cl. ...................... 250/548; 250/559.3; 356/400
[58] Field of Search ............................ 250/548, 559.3, 250/559.37, 559.49; 356/399, 400, 401; 355/53; 364/559

[56] References Cited

U.S. PATENT DOCUMENTS

| 4,677,301 | 6/1987 | Tanimoto et al. | 250/548 |
| 4,699,515 | 10/1987 | Tanimoto et al. | 356/401 |
| 4,780,616 | 10/1988 | Nishi et al. | 250/548 |
| 4,780,617 | 10/1988 | Umatate et al. | 250/548 |
| 4,833,621 | 5/1989 | Umatate | 364/491 |
| 4,853,745 | 8/1989 | Kamiya et al. | 355/43 |
| 4,962,318 | 10/1990 | Nishi | 250/548 |
| 5,117,255 | 5/1992 | Shiraishi et al. | 355/53 |
| 5,118,953 | 6/1992 | Ota et al. | 250/548 |
| 5,138,176 | 8/1992 | Nishi | 250/548 |
| 5,151,750 | 9/1992 | Magome et al. | 356/401 |

*Primary Examiner*—Que T. Le
*Attorney, Agent, or Firm*—Shapiro and Shapiro

[57] ABSTRACT

Measured is a coordinate position, on a static coordinate system, of each of some specified areas selected from a plurality of areas on a substrate. The coordinate positions of some specified areas undergo a weighted averaging process by use of such a weight that it decreases with a larger distance between the specified areas. The coordinate position is thereby smoothed per specified area. The weight is given to each of some smoothed coordinate positions, and, thereafter, a statistic calculation is effected. The coordinate position, on the static coordinate system, of the area on the substrate is thereby obtained. The substrate is sequentially located based on the obtained coordinate position, and each area on the substrate is thus aligned to a predetermined position.

24 Claims, 21 Drawing Sheets

METHOD FOR ALIGNING PROCESSING AREAS ON A SUBSTRATE WITH A PREDETERMINED POSITION IN A STATIC COORDINATE SYSTEM

BACKGROUND OF THE INVENTION

1. Field of the Invention

The present invention relates to an alignment method suitable for an exposure apparatus, a repairing apparatus and an inspecting apparatus which are employed in the process of manufacturing, e.g., a semiconductor device, a liquid crystal display device and a thin-film magnetic head.

2. Related Background Art

In the process of manufacturing a semiconductor device, etc., particularly in a photolithography process, there is employed a projection exposure apparatus (a stepper) for transferring a pattern on a mask or a reticle (hereinafter generically termed a reticle) onto a substrate (a semiconductor wafer, a glass plate or the like) coated with a photosensitive material (a photoresist) via a projection optical system. When projection-exposing the reticle pattern on a shot area on the wafer while being overlapped therewith, it is required that a projected image of the reticle pattern be aligned exactly with the shot area, i.e., that the reticle be aligned exactly with the wafer. At present, a dominant method in the stepper is an enhanced global alignment (EGA) method disclosed in U.S. Pat. No. 4,780,617 and U.S. Pat. No. 4,833,621.

Now, a plurality of shot areas on the wafer are regularly arrayed based on predetermined array coordinates. Even when stepping the wafer on the basis of design array coordinate values (array of shot areas) of the plurality of shot areas on the wafer, however, each shot area is not necessarily precisely aligned due to the following factors:

(1) a residual rotational error θ of the wafer;

(2) a degree-of-orthogonality error w of a stage coordinate system (or the array of shot areas);

(3) wafer linear expansions (scaling) Rx, Ry; and (4) offsets (parallel movements) Ox, Oy of the wafer (a central position).

Herein, the on-wafer array coordinates on the basis of four error quantities (six parameters) can be described by a linear transformation formula. Then, according to the EGA method, a linear transformation model for transforming a coordinate system (x, y) into a stage coordinate system (X, Y) is expressed as shown in the following formula by use of the six transform parameters a–f:

$$\begin{bmatrix} X \\ Y \end{bmatrix} = \begin{bmatrix} a & b \\ c & d \end{bmatrix} \begin{bmatrix} x \\ y \end{bmatrix} + \begin{bmatrix} e \\ f \end{bmatrix} \quad (1)$$

The six transform parameters a–f in the formula (1) can be obtained by use of, e.g., the least squares method. That is, each of n-pieces of shot areas (hereinafter called sample shot areas) selected from a plurality of shot areas on the wafer is aligned to a predetermined fiducial position in accordance with array coordinates (x1, y1), . . . , (xn, yn) in terms of design. Measured subsequently is each of coordinate values (XM1, YM1), . . . , (XMn, YMn), on the stage coordinate system, of each of the n-pieces of sample shot areas.

Regarded herein as alignment errors are differences (Δx, Δy) between the design array coordinates (xi, yi) (i=1, 2, . . . , n) obtained by substituting the sample shot areas into the linear transformation model of the formula (1) and the above measured values (XMi, YMi). At this time, the alignment error Δx is expressed by $\Sigma(Xi-XMi)^2$, while the alignment error Δy is expressed by $\Sigma(Yi-YMi)$.

Next, the alignment errors Δx, Δy are partially differentiated in sequence by the six transform parameters a–f, and there is established such an equation as making its value 0. These six simultaneous equations are solved, thereby obtaining the six transform parameters. Then, the array coordinates of all the shot areas on the wafer are calculated from the formula (1) by use of the thus obtained transform parameters a–f. When the wafer is located according to the thus calculated array coordinates, all the shot areas can be accurately aligned. Note that e.g., second- or higher-order equations are, as is proposed in Ser. No. 011,697 (Feb. 1, 1993) now abandoned, employed if a good approximate accuracy is not obtained in the above linear transformation model (the formula (1)).

By the way, the linear approximation is effected according to the EGA method, and hence, if the wafer has a non-linear distortion, there exists a drawback to reduce the alignment accuracy. Under such circumstances, Ser. No. 005,146 (Jan. 15, 1993) now abandoned proposes a weighted EGA method for obtaining the transform parameters a–f in the formula (1) by using the least squares method. This method involves a step of expressing the alignment errors Δx, Δy such as $\Sigma Wi (Xi-XMi)^2$, $\Sigma Wi (Yi-YMi)^2$ by employing the weight Wi corresponding to a distance between one shot area on the wafer and each of the n-pieces of sample shot areas.

According to the weighted EGA method, the weight Wi increases with respect to the sample shot area closer to the shot area. The reason for this is that the sample shot area in closer proximity to the shot area, it is considered, undergoes a smaller influence of the non-linear distortion. However, it may happen that a non-linear distortion quantity does not depend on the distance between the shot area and the sample shot area. For example, if a local non-linear distortion exists, the distortion quantity increases without depending on the above distance in some cases. For this reason, even when adopting the weighted EGA method, there is a drawback in which the alignment errors due to the non-linear distortion can not be reduced.

According further to the weighted EGA method, the sample shot areas effective in use for calculating the coordinate positions of the shot areas exist in a circle having a predetermined radius about the shot area concerned. A range (area) where these effective sample shot areas exist is termed a [zone]. Accordingly, an outline of the zone assumes a substantially circular shape with respect to the shot areas existing at the center of the wafer. In contrast with this, when the shot areas are disposed along the periphery of the wafer, the zone takes a partially-chipped circle, resulting in a reduction in terms of the number of effective sample shot areas. Consequently, data about the distortion can not be accurately obtained in the peripheral portion of the wafer. An averaging effect by the plurality of sample shot areas can not be expected, and, hence, there arises a disadvantage of worsening an accuracy of calculating the coordinate positions. For avoiding this, if a large number of sample shot areas are disposed along the periphery of the wafer, the distortion data become excessive in the peripheral portion thereof. The calculation accuracy of the coordinate positions relatively decreases at the central portion of the wafer where a small number of sample shot areas exist. Further, if a total number of sample shot areas increases, there is produced such a drawback that a throughput decreases because of taking much time for the coordinate measurement.

Further, an alignment sensor for detecting alignment marks for the sample shot areas in order to measure the coordinate positions thereof has a scatter in terms of a measurement reproducibility (a measurement accuracy). For instance, when measuring the coordinate positions of the sample shot areas by employing the alignment sensor exhibiting a bad measurement reproducibility, the measured coordinate position may deviate largely from a true value. Accordingly, even when adopting the weighted EGA method, and if the above-mentioned coordinate positions exhibiting a low reliability are used, there is caused a drawback of decreasing the alignment accuracy. This will be specifically explained with reference to FIGS. 22 and 23.

Referring to FIGS. 22 and 23, the horizontal axis indicates X-coordinates of the stage coordinate system, while the vertical axis of ordinate indicates a X-directional deviation quantity $\delta X$ of a true coordinate position with respect to a design coordinate position (when linear/non-linear distortions and scaling are not caused) in the shot area.

Turning to FIG. 22, a curve 170 represents the X-directional true deviation quantity $\delta X$ of each shot area, and points 171A–171I shown by white or black circles respectively indicate X-directional deviation quantities of nine sample shot areas which are measured by using the alignment sensor. Further, as shown by error bars added to the respective points 171A–171I, each measured value of the alignment sensor has a scatter on the order of $\pm\sigma_1$ (a standard deviation $\sigma$ or $3\sigma$). When calculating a coordinate position of the sample shot area corresponding to, e.g., the point 171G by the weighted EGA method, the point 172G on an approximate straight line 172 obtained by giving a large weight to each of the coordinate positions of the sample shot areas corresponding to the points 171F, 71G, 171H in the vicinity thereof turns out an X-directional deviation quantity of the coordinate position in terms of calculation. At this time, as illustrated in FIG. 22, if the scatter $\sigma_1$ of the measured result is small, viz., if a good measurement reproducibility is exhibited, a difference between the calculated coordinate position and the true coordinate position on the curve 170 is small. Then, it follows that the alignment can be performed with a high accuracy.

On the other hand, FIG. 23 shows a case where a scatter $\pm\sigma_2$ of the measured result is larger (a bad measurement reproducibility) than in FIG. 22. Referring to FIG. 23, a curve 173 indicates an X-directional true deviation quantity $\delta X$ of each shot area. Points 174A–174I marked with white or black circles represent X-directional deviation quantities of the nine sample shot areas which are measured by use of the alignment sensor. When calculating the coordinate position of the sample shot area corresponding to, e.g., the point 174G by the weighted EGA method, the point 175G on an approximate straight line 175 obtained by giving a larger weight to each coordinate position of the sample shot areas corresponding to the points 174F, 174G, 174H in the vicinity thereof turns out an X-directional deviation quantity of the calculated coordinate position. As shown in FIG. 23, if a scatter $\sigma_2$ of the measured result is large, however, there increases a difference between the calculated coordinate position and the true coordinate position on the curve 173. That is, if the measurement reproducibility is bad, the coordinate position calculated based on the weighted EGA method deviates by a measurement error, resulting in such a drawback that the alignment accuracy is not improved so much.

SUMMARY OF THE INVENTION

It is a first object of the present invention to provide a method capable of aligning shot areas on a substrate with a high accuracy at a high speed even if a local non-linear distortion exists in the substrate. Further, it is a second object of the present invention to provide a method capable of performing the alignment with the high accuracy over the entire surface of the substrate without increasing the number of sample shot areas. Moreover, it is a third object of the present invention to provide a method capable of aligning the shot area on the substrate with the high accuracy at the high speed even when exhibiting a bad measurement reproducibility (a measurement accuracy) of an alignment sensor for measuring the coordinate position of the sample shot area.

According to the alignment method of the present invention, each of a plurality of areas to be processed on the substrate is aligned to a predetermined position within a static coordinate system for prescribing a moving position of the substrate. Measured in advance of this step is a coordinate position, on the static coordinate system, of each of at least three processed areas. The plurality of these measured coordinate positions are statistically calculated, thereby calculating the coordinate position, on the static coordinate system, of each of the plurality of processed areas on the substrate. The moving position of the substrate is controlled based on each of the calculated coordinate positions of the plurality of processed areas. Each of the plurality of processed areas is thereby aligned to the predetermined position.

A first method for accomplishing the first object of the present invention comprises a first step of allocating a weighting coefficient to each of at least three processed areas selected beforehand in accordance with a state of distortion of the substrate and a second step of measuring coordinate positions, on the static coordinate system, of the previously selected processed areas. The first method also comprises a third step of determining values of a set of transform parameters per processed area to minimize a residual error component obtained by adding an error component to all the processed areas selected beforehand, the error component being obtained by multiplying a square of a difference, by a weighting coefficient, between the coordinate position on the static coordinate system which is calculated by use of the set of transform parameters from array coordinates of the previously selected processed areas and the coordinate position measured in the second step. The first method further comprises a fourth step of calculating the coordinate positions on the static coordinate system by using the obtained values of the set of transform parameters per processed area.

According to the first method, for instance, the non-linear distortion quantity in each processed area is obtained by measuring the coordinate positions of all the processed areas on the substrate. Then, when calculating the coordinate position of one target processed area on the substrate, a small weighting coefficient is given to the processed area (the sample shot area) interposed between the target processed area and a local zone where the processed area having a non-linear distortion with a tendency different from the target processed area. Furthermore, the target processed area is aligned by the weighted EGA method. Therefore, even if the local distortion exists in the substrate, each processed area can be aligned with the high accuracy.

Further, a second method for accomplishing the first object is an improvement of the first method. According to the second method, the above-described first through fourth steps are executed on a first substrate having the plurality of processed areas. In addition a state of distortion of a second substrate having a plurality of processed areas is measured. Then, if a correlation in the state of distortion between the first and second substrates is high, there is obtained a relative rotational angle between the distortion state of the first substrate and the distortion state of the second substrate. Moreover, a weighting coefficient equivalent to that of being rotated through the rotational angle obtained on the first substrate is allocated to each of at least three previously selected processed areas on the second substrate.

According to the second method, if the correlation in the distortion state between the first and second substrates is high, the relative rotational angle between the distortion states of the two substrates is obtained. Obtained further is the weighting coefficient corresponding to the distortion state, which is to be given to each of at least three processed areas selected beforehand with respect to the first substrate. Further, in regard to the second substrate, there is employed a weighting coefficient obtained by rotating a distribution of the weighting coefficients obtained on the first substrate through the rotational angle obtained previously. It is therefore possible to reduce the time for determining the weighting coefficient on the second substrate.

A method for accomplishing the second object of the present invention comprises a first step of measuring a coordinate position, on the static coordinate system, of each of at least three specified areas selected from a plurality of processed areas on the substrate. This method also comprises a second step of setting areas other than the specified areas on the substrate or virtual specified areas outwardly of the substrate. The method further comprises a third step of estimating the coordinate positions, on the static coordinate system, of the virtual specified areas on the basis of the plurality of coordinate positions measured in the first step. The coordinate position, on the static coordinate system, of each of the plurality of processed areas on the substrate is calculated by statistically calculating the coordinate positions measured in the first step and the coordinate positions of the virtual specified areas which have been estimated in the third step.

The number of the specified areas (the sample shot areas) effective in use for calculating the coordinate positions is smaller than that of the processed areas existing at the center of the substrate with respect to the processed areas existing along the periphery of the substrate. Then, for instance, the virtual specified areas are set outwardly of the substrate. The coordinate positions of the virtual specified areas are estimated based on the coordinate positions of the specified areas which have been previously measured. Subsequently, The calculation of the coordinate positions of the processed areas existing along the periphery of the substrate involves the use of not only the previously measured coordinate positions of the specified areas but also the estimated coordinate positions of the virtual specified areas. For this reason, even in the case of the processed areas having a small number of the specified areas on the circumference thereof, it is possible to effect the alignment with high accuracy at high speed without increasing the number of the specified areas where the coordinate measurement is to be performed. Further, even in the case of the processed areas existing in the vicinity of the center of the substrate, and if there are a small number of the effective specified areas on the circumference thereof, the coordinate positions may be calculated by use of the estimated coordinate positions by similarly setting the virtual specified areas. Accordingly, even in the case of the processed areas having a small number of the effective processed areas on the circumference thereof, the number of the effective specified areas can be substantially incremented by estimating the coordinate positions of the virtual specified areas. A high-accuracy and high-speed alignment is thereby attainable.

The first method for accomplishing a third object of the present invention comprises a first step of measuring the coordinate position, on the static coordinate system, of each of at least three specified areas selected from the plurality of processed areas on the substrate. This first method also comprises a second step of smoothing a coordinate position of a target specified area by weight-averaging the coordinate position of one target specified area on the substrate which has been measured in the first step and the coordinate positions of the specified areas existing along the periphery thereof. This method further comprises a third step of performing a statistical calculation by giving, to the coordinate position smoothed in the second step, a weight corresponding to a positional relationship between one specified processed area on the substrate and each of at least three specified areas and thereby calculating the coordinate position, on the static coordinate system, of one processed area.

According to the first alignment method, the coordinate position is smoothed (weight-averaged) per specified area in the second step, thereby reducing a measurement error of an alignment sensor. For this reason, measurement error components are substantially eliminated from the coordinate positions of the specified areas, and mainly only the distortion data are contained therein. Accordingly, the coordinate positions of the processed areas are calculated (undergo the weighted EGA) by use of the smoothed coordinate positions. Hence, even if the alignment sensor exhibits a bad measurement reproducibility (measurement accuracy), the processed areas can be aligned with the high accuracy.

Further, a second method of accomplishing the third object of the present invention comprises a first step of measuring the coordinate position, on the static coordinate system, of each of at least three specified areas selected from the plurality of processed areas on the substrate. The second method also comprises a second step of estimating the coordinate position, on the static coordinate system, of the target process area by smoothing (weight-averaging) the coordinate positions of the plurality of specified areas along the circumference of the target processed area on the substrate which have been measured in the first step. The target processed area is aligned to a predetermined position by using the coordinate positions estimated in the second step.

According to the second alignment method, the coordinate positions, on the static coordinate system, of all the processed areas on the substrate are estimated by smoothing (weight-averaging) the coordinate positions of the plurality of specified areas. The processed area is aligned to the predetermined position by locating the substrate in accordance with these estimated coordinate positions. Alternatively, all the processed areas on the substrate are regarded as the specified areas. A weight is given to each of the plurality of estimated coordinate positions, thus performing the statistical calculation. The coordinate positions, on the static coordinate system, of the processed areas on the substrate are thereby obtained. Accordingly, the measurement errors of the alignment sensor are substantially eliminated, and the coordinate calculation can be conducted chiefly by using the measured result containing only the distortion data. Therefore, even when the alignment sensor has a bad measurement reproducibility (measurement accuracy), the processed area can be aligned with the high accuracy.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 2:
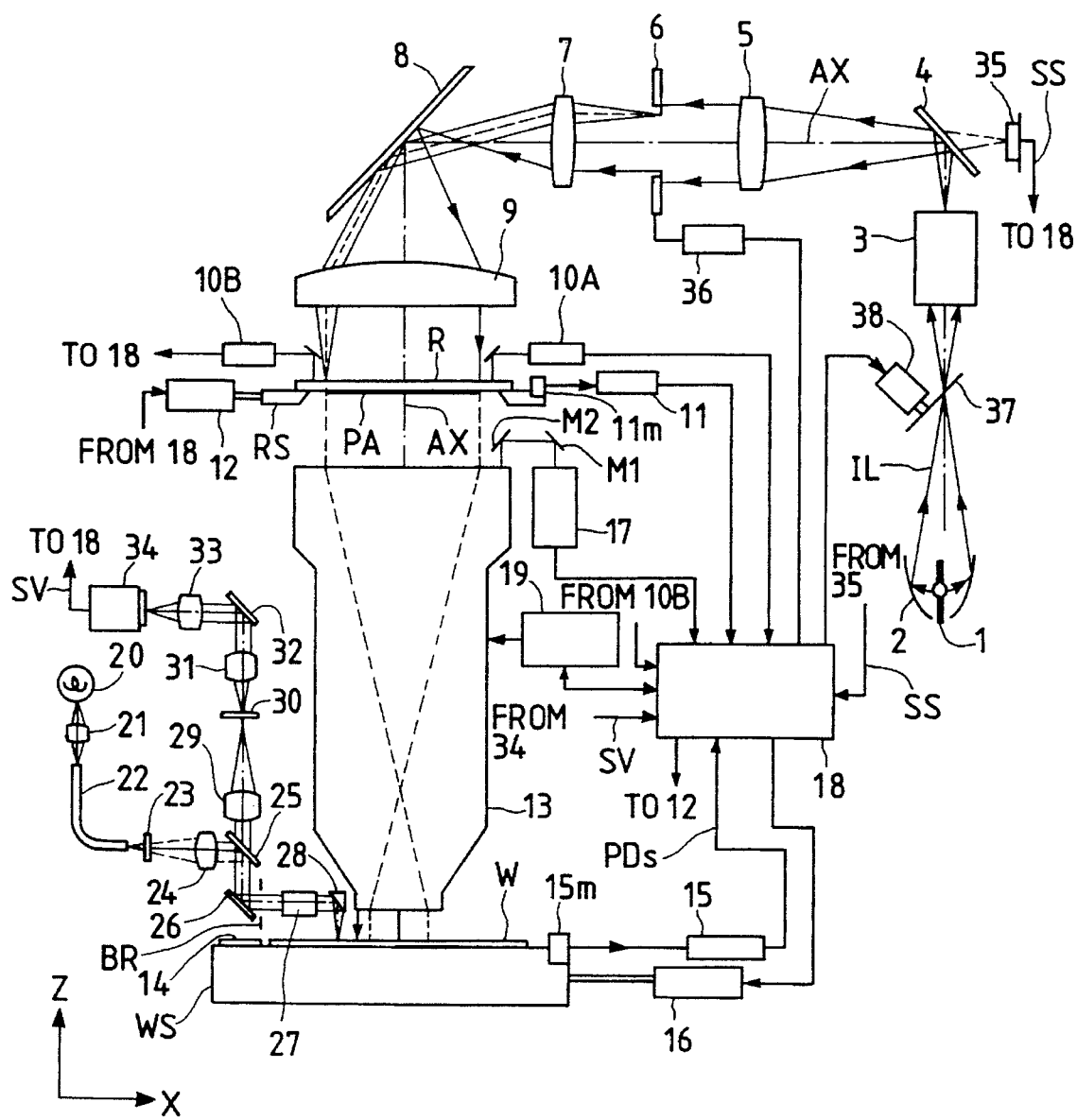
FIG. 2 is a view schematically illustrating a projection exposure apparatus to which the alignment method of this invention is applied.

FIG. 2 schematically illustrates a construction of a projection exposure apparatus suited to apply an alignment method according to the present invention. Referring to FIG. 2, beams of illumination light generated from a ultra high pressure mercury-arc lamp 1 are reflected by an elliptical mirror 2 and converged once at a second focal point thereof. Thereafter, the converged light is incident on an illumination optical system including a collimator lens, an interference filter (a wavelength selecting element), an optical integrator (a fly-eye lens) and an aperture stop (a σ-stop). The fly-eye lens (unillustrated) is disposed within a plane perpendicular to an optical axis AX so that a reticle-side focal plane is substantially coincident with a Fourier transform plane with respect to a pattern forming surface of a reticle R. Further, a shutter (e.g., a 4-blade rotary shutter) 37 is disposed in the vicinity of a second focal point of the elliptical mirror 2. The shutter 37 opens and intercepts an optical path from the illumination light IL with the aid of a motor 38. Note that the illumination light for exposure may involve the use of, in addition to luminescent lines of the ultra high pressure mercury-arc lamp or the like, a laser beam of an excimer laser (a KrF excimer laser, an ArF excimer laser, etc.) or higher harmonic waves of a metallic vapor laser and a YAG laser.

The illumination optical system 3 emits the illumination light (i-line) IL in a wavelength band to photosensitize a resist layer. A large part of the illumination light IL is reflected by a beam splitter 4. The illumination light IL thereafter passes through a first relay lens 5, a variable field stop (a reticle blind) 6 and a second relay lens 7 and reaches a mirror 8. Further, the illumination light IL is reflected by the mirror 8. The illumination light IL is thrown onto a pattern area PA of the reticle R is illuminated with a substantially uniform illuminance through a condenser lens 9. A plane on which the reticle blind 6 is disposed is in a conjugate relationship (an image forming relationship) with the pattern forming surface of the reticle R. It is therefore possible to arbitrarily set an illumination field of the reticle R by changing a configuration and a size of the aperture. This involves an operation of independently driving each of a plurality of movable blades constituting the reticle blind 6 through a driving system 36.

Now, the reticle in FIG. 2 has alignment marks formed at substantially central portions of four sides of the rectangular pattern area PA surrounded with a masking band having a predetermined width. Images of these on-reticle-R alignment marks (hereinafter simply termed reticle marks) are projected on the resist layer of the wafer W via a projection optical system 13. With this projection, it follows that latent images of the reticle marks are formed on the resist layer. Further, these reticle marks are also used for an alignment of the reticle R with each shot area on the wafer W. Two pieces of the face-to-face reticle marks on the reticle R are defined as multi marks in which five diffraction grating marks are arrayed at predetermined spacings in an X-direction. The diffraction grating marks are composed of seven dot marks arranged in, e.g., a Y-direction. The remaining two reticle marks are multi marks rotated through 90°. These reticle marks composed of masking members of chromium or the like are formed in transparent windows provided in the masking band. Further, the reticle R has two pieces of masking cross marks formed in a face-to-face relationship in the vicinity of the periphery thereof. These two cross marks are employed for the alignment (with the optical axis AX of the projection optical system 13) of the reticle R.

A micromotion of the reticle R can be made by a motor 12 along the optical axis direction AX of the projection optical system 13. The reticle R is also inclinable to a plane perpendicular to the optical axis AX. The reticle R is, at the same time, placed on a reticle stage RS capable of making micro-rotations and two-dimensional movements within the plane perpendicular to the optical axis AX. A movable mirror 11m is fixed to an edge of the reticle stage RS. The movable mirror 11m reflects a laser beam from a laser light wave interference length measuring machine (a laser interferometer) 11. The laser interferometer 11 always detects two-dimensional positions of the reticle stage RS with a resolving power on the order of, e.g., 0.01 µm. Further, two sets of reticle alignment systems (RA systems) 10A, 10B are disposed upwardly of the reticle R. The RA systems 10A, 10B detect two cross marks formed in the vicinity of the outer periphery of the reticle R. Based on measuring signals transmitted from the RA systems 10A, 10B, the micromotions of the reticle stage RS are caused in the X-, Y- and θ-directions. The reticle R is thereby located so that a central point of the pattern area PA is coincident with the optical axis AX of the projection optical system 13.

Now, the illumination light IL passing through the pattern area PA of the reticle R is incident on the projection optical system 13 that is telecentric on both sides. The projection optical system 13 reduces a projection image of a circuit pattern of the reticle R down to, e.g., ⅕. The projection image is projected on the wafer W having the resist layer formed on the surface and held so that the surface thereof is substantially coincident with the best image forming plane of the projection optical system 13.

The wafer W is vacuum-adsorbed by a wafer holder (not illustrated) capable of making the micro rotations. The wafer W is held on the wafer stage WS through this wafer holder. The wafer stage WS is so constructed as to be two-dimensionally movable by a motor 16 on the basis of a step-and-repeat method. When finishing a transfer exposure of the reticle R with respect to one shot area on the wafer W, the wafer stage WS is stepped to a next shot position. A movable mirror 15m for reflecting the laser beam from the laser interferometer 15 is fixed to the edge of the wafer stage. The laser interferometer 15 always detects two-dimensional positions of the wafer stage WS with a resolving power on the order of, e.g., 0.01 µm. That is, the laser interferometer 15 determines a static coordinate system (a rectangular coordinate system). The static coordinate system serves to prescribe moving positions of the wafer stage WS within the plane perpendicular to the optical axis AX of the projection optical system 13.

Further, the wafer stage WS is mounted with a fiducial member (a glass substrate) 14 employed for a baseline measurement in such a way that the fiducial member 14 is substantially flush with the surface of the wafer W. The fiducial member 14 is formed with a slit pattern consisting of five sets of L-shaped patterns assuming a light transmissive property. The fiducial member 14 is also formed with two sets of fiducial patterns (a duty ratio is 1:1) assuming a light reflective property. One set of fiducial patterns are composed of first and second marks arranged in the X-direction. The first marks are configured such that three diffraction grating marks consisting of seven dot marks arranged in the Y-direction are arrayed in the X-direction. The second marks are configured such that twelve bar marks extending in the Y-direction are arrayed in the X-direction. The other set of fiducial patterns are formed by rotating the above one set of fiducial patterns through 90°.

Now, referring to FIG. 2, the illumination light (an exposure light) is transferred downwardly of the fiducial member 14 by use of optical fibers and mirrors. The slit patterns of the fiducial member 14 are illuminated with the illumination light from under (an interior of the wafer stage). The illumination light penetrates the slit patterns of the fiducial member 14. The illumination light then travels through the projection optical system 13 and forms projection images of the slit patterns on the rear surface (a pattern forming surface) of the reticle R. Further, illumination light passing through one of the four reticle marks formed on the reticle R reaches the beam splitter 4 via the condenser lens 9 and the relay lenses 7, 5. Moreover, the illumination light penetrating the beam splitter 4 falls on a photoelectric detector 35 having its light receiving surface located within a plane substantially conjugate to a pupil plane (a Fourier transform plane with respect to the pattern forming surface of the reticle R) of the projection optical system 13. The photoelectric detector 35 outputs a photoelectric signal SS corresponding to an intensity of the illumination light to a main control system 18. Hereinbelow, the optical fibers, the mirrors, the fiducial member 15 and the photoelectric detector 35 are collectively termed an ISS (Imaging Slit Sensor) system. A detailed configuration of the ISS system is disclosed in, e.g., U.S. Pat. No. 4,780,616 and U.S. Pat. No. 4,853,745.

Further, FIG. 2 illustrates an imaging characteristic correcting unit 19 for adjusting an imaging characteristic of the projection optical system 13. The imaging characteristic correcting unit 19 corrects the imaging characteristic of the projection optical system 13 by independently driving some of lens elements constituting the projection optical system 13, especially each of a plurality of lens elements closer to the reticle R. The imaging characteristic correcting unit 19 corrects, a projection magnification, a distortion, a curvature of field, etc. A specific configuration of the imaging characteristic correcting unit 19 is disclosed in, e.g., U.S. Pat. No. 5,117,255.

Additionally, an alignment sensor (hereinafter called a Field Image Alignment (FIA) system) by an off-axis method is provided sideways of the projection optical system 13. In the FIA system, beams of wide-band light generated by a halogen lamp 20 are guided via a condenser lens 21 and a optical fiber 22 to an interference filter 23. The interference filter 23 cuts off light beams in an infrared zone and such a wavelength band as to photosensitize the resist layer. The light beams penetrating the interference filter 23 are incident on a telecentric objective lens 27 via a lens system 24, a beam splitter 25, a mirror 26 and a field stop BR. Light beams outgoing from the objective lens 27 are reflected by a prism (or a mirror) 28 fixed to a lower portion of a lens barrel for the projection optical system 13 so as not to intercept an illumination field of the projection optical system 13. The light beams then substantially vertically fall on the wafer W.

Segmented areas inclusive of alignment marks (hereinafter simply termed wafer marks) on the wafer W are irradiated with the light beams coming from the objective lens 27. The light beams reflected from the relevant areas are guide to a fiducial plate 30 via the prism 28, the objective lens 27, the field stop BR, the mirror 26, the beam splitter 25 and a lens system 29. The fiducial plate 30 is disposed within a plane conjugate to the wafer W with respect to the objective lens 27 and the lens system 29. Images of the wafer marks are formed within transparent windows of the fiducial plate 30. Further, the fiducial plate 30 is formed with two rectilinear fiducial marks in the transparent windows thereof, the marks extending in the Y-direction and being spaced at a predetermined interval in the X-direction. The light penetrating the fiducial plate 30 is guided to an imaging device (a CCD camera or the like) 34 via a first relay lens system 31, a mirror 32 and a second relay lens system 33. Images of the wafer marks and the fiducial marks are formed on the light receiving surface of the imaging device 34. An imaging signal SV from the imaging device 34 is supplied to the main control system 18, wherein an X-directional position (a coordinate value) of the wafer mark is calculated. A configuration of the FIA system is disclosed also in, e.g., U.S. Pat. No. 4,962,318. There is, though not shown in FIG. 2, provided another FIA system (hereinafter referred to as a Y-FIA system) for detecting mark positions in the Y-direction in addition to the FIA system (referred to as an X-FIA system) having the above configuration.

Referring further to FIG. 2, an alignment sensor 17 based on a TTL (Through The Lens) method is disposed in the apparatus. Beams of illumination light from the alignment sensor 17, e.g., He-Ne laser beams having a wavelength on the order of 633 nm, fall on the wafer W via mirrors M1, M2 and the projection optical system 13. The light beams reflected from the wafer marks travel back to the alignment sensor 17 via the projection optical system 13 and the mirrors M2, M1. The alignment sensor 17 obtains positions of the wafer marks on the basis of signals acquired by photoelectrically converting the reflected light.

Figure 3:
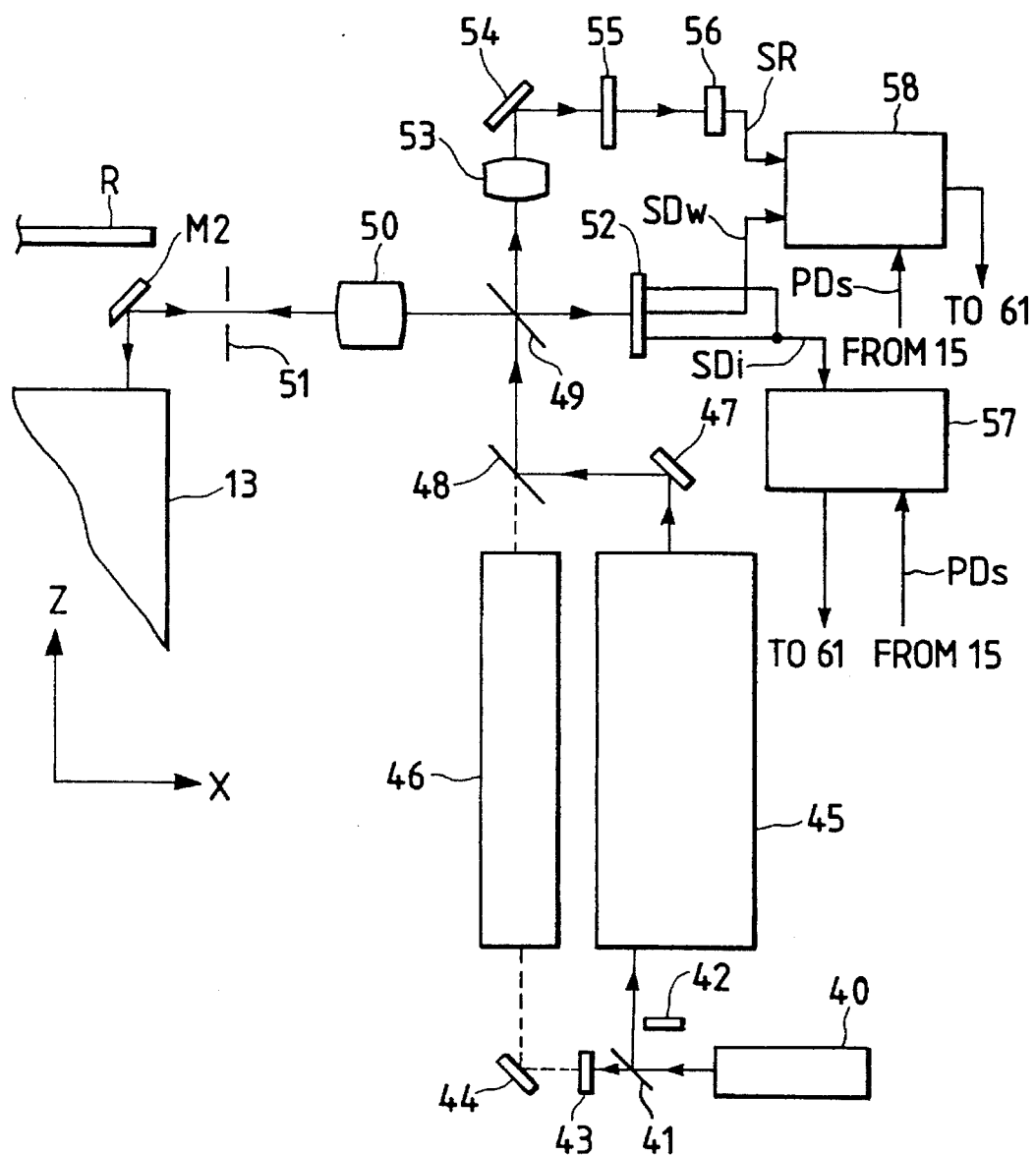
FIG. 3 is a view illustrating a detailed construction of an alignment sensor based on a TTL method in FIG. 2.

FIG. 3 illustrates a detailed configuration of the TTL system alignment sensor 17. The alignment sensor 17 is a combined version of an alignment system (hereinafter referred to as a Laser Interferometric Alignment (LIA) system) based on a 2-light-flux interference method which is disclosed in, e.g., U.S. Pat. No. 5,118,953 and an alignment system (hereinbelow termed a Laser Step Alignment (LSA) system) by a diffraction method which is disclosed in, e.g., U.S. Pat. No. 4,699,515, wherein the systems share the optical members with each other at the maximum. Although a brief description thereof will be given herein, the detailed configuration is disclosed in U.S. Pat. No. 5,151,750.

Turning to FIG. 3, laser beams emitted from an He-Ne laser light source 40 are split by a beam splitter 41. The laser beams reflected therefrom are incident on a first beam shaping optical system (an LIA optical system) 45 via a shutter 42. On the other hand, the laser beams penetrating the beam splitter 41 are incident on a second beam shaping optical system (an LSA optical system) 46 via a shutter 43 and a mirror 44. Accordingly, the LIA system and the LSA system are switchable when used by independently driving the shutters 42, 43.

Now, the LIA optical system 45 includes two sets of acoustic optical modulators (AOMs). The LIA optical system 45 emits two laser beams substantially in symmetry with respect to its optical axis, to which a predetermined frequency difference Δf is given. Further, the two laser beams emitted from the LIA optical system 45 reach a beam splitter 49 via a mirror 47 and a beam splitter 48. The two laser beams penetrating the beam splitter 49 are incident on a reference diffraction grating 55 fixed onto the apparatus at a predetermined intersecting angle from two directions different from each other via a lens system (an inverse Fourier transform lens) 53 and a mirror 54. The incident laser beams then form an image (intersection). A photoelectric detector 56 receives interference light beams of diffracted light beams generated substantially in the same direction when the reference diffraction grating 55 transmits the laser beams. The photoelectric detector 56 outputs a sine wave photoelectric signal corresponding to an intensity of the diffracted light to a main control system 18 (an LIA arithmetic unit 58 in FIG. 4).

Figure 4:
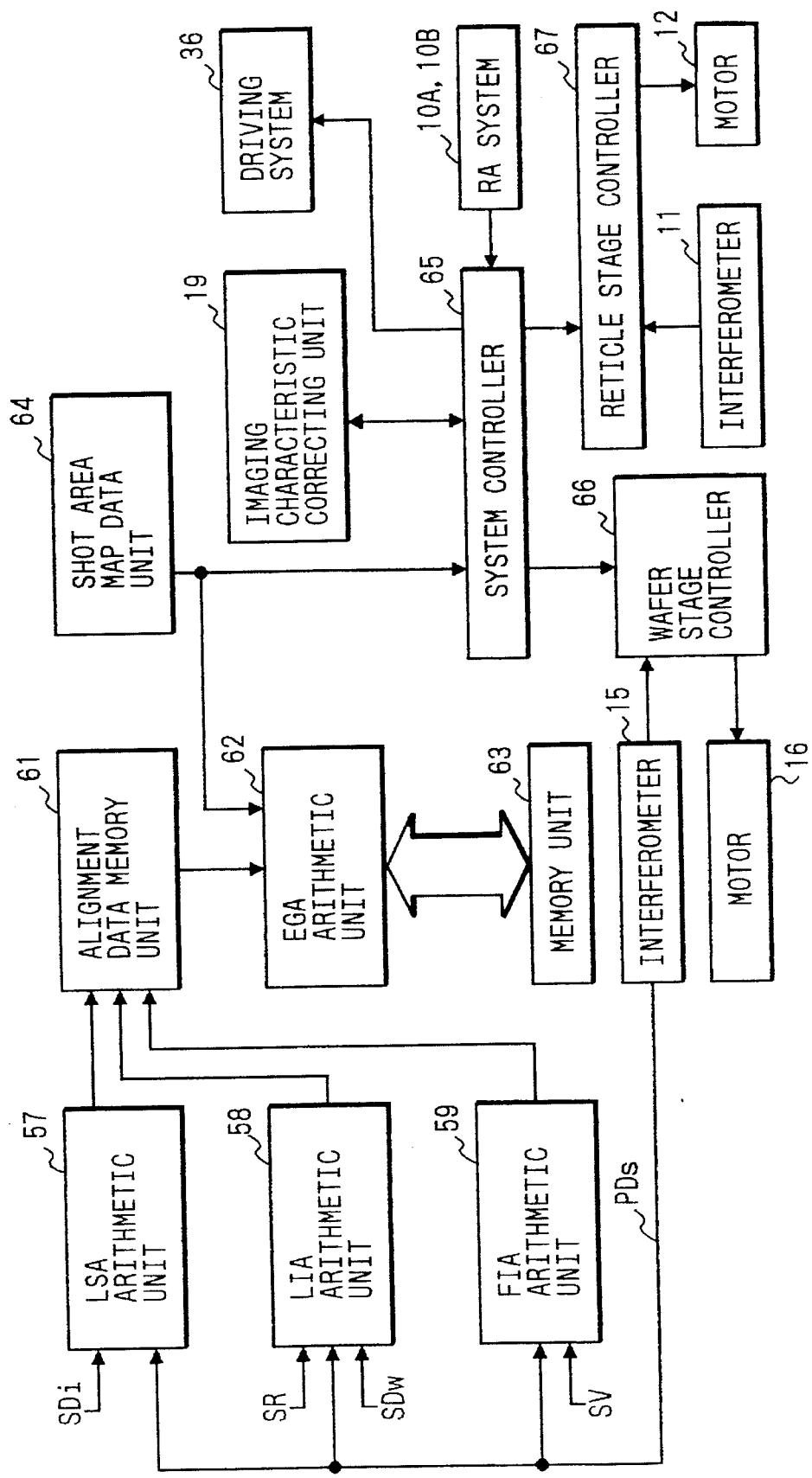
FIG. 4 is a block diagram showing a detailed construction of a control system of the projection exposure apparatus of FIG. 2.

On the other hand, the two streaks of laser beams reflected by the beam splitter 49 intersect once at a field stop 51 through an objective lens 50. Thereafter, the laser beams enter the projection optical system 13 via the mirror M2 (the illustration of the mirror M1 in FIG. 2 is omitted). The two laser beams incident on the projection optical system 13 become substantially symmetric with respect to the optical axis AX on the pupil plane of the projection optical system 13 and once converge spotwise. Thereafter, the laser beams turn out parallel beams inclined to each other at a symmetric angle with respect to the optical axis AX in the pitch-direction (the Y-direction) of the wafer marks on the wafer W. The parallel beams are incident on the wafer marks at a predetermined intersection angle from two directions different from each other. Formed on the wafer marks are one-dimensional interference fringes moving at a velocity corresponding to the frequency difference Δf. Two streaks of diffracted light beams generated in the same direction from the relevant marks-i.e., ± first-order diffracted light beams (the interference light beams) generated herein in the optical axis direction are incident on the photoelectric detector 52 via the projection optical system 13 and the objective lens 50. The photoelectric detector 52 outputs, to the LIA arithmetic unit 58 (FIG. 4), a sine wave photoelectric signal SDw corresponding to a period in terms of variations in brightness of the interference fringes. The LIA arithmetic unit 58 calculates a positional deviation quantity of the wafer marks from a phase difference in terms of waveforms between the two photoelectric signals SR, SDw. The LIA arithmetic unit 58, at the same time, obtains coordinate positions of the wafer stage WS when the positional deviation quantity comes to zero by use of a position signal PDs transmitted from the laser interferometer 15. The LIA arithmetic unit 58 outputs this item of data to an alignment data memory unit 61 (FIG. 4).

Further, the LSA optical system 46 includes a beam expander and a cylindrical lens. The laser beams outgoing from the LSA optical system 46 enter the objective lens 50 via the beam splitters 48, 49. The laser beams outgoing from the objective lens 50 are converged spotwise at the field stop 51 and thereafter incident on the projection optical system via the mirror M2. The laser beams entering the projection optical system 13 travel through substantially the center of the pupil plane and thereafter extend in the X-direction within the projection field. The laser beams then fall on the wafer W in the form of elongate band-like spot beams going toward the optical axis AX.

Furthermore, when relatively moving the spot beams and the wafer marks (diffraction grating marks) on the wafer W in the Y-direction, the light beams generated from these marks are received by the photoelectric detector 52 through the projection optical system 13 and the objective lens 50. The photoelectric detector 52 photoelectrically converts only ± first- to ± third-order diffracted light beams among the light beams coming from the wafer marks. The photoelectric detector 52 outputs photoelectric signals SDi corresponding to intensities of those diffracted light beams to the main control system 18 (an LSA arithmetic unit 57 in FIG. 4). The LSA arithmetic unit 57 inputs position signals PDs from the laser interferometer 15. The LSA arithmetic unit 57 effects sampling on the photoelectric signals SDi in synchronism with up-and-down pulses generated per unit moving quantity of the wafer stage WS. Further, the LSA arithmetic unit 57 converts each sampling value into a digital value and stores the memory with the sampling values according to the sequence of addresses. Thereafter, the LSA arithmetic unit 57 calculates Y-directional positions of the wafer marks by a predetermined arithmetic operation. The LSA arithmetic unit 57 outputs this item of data to the alignment data memory unit 61 (FIG. 4).

Next, the control system of the projection exposure apparatus of FIG. 2 will be explained with reference to FIG. 4. FIG. 4 is a block diagram illustrating the control system of FIG. 2. The main control system 18 shown in FIG. 2 comprises the LSA arithmetic unit 57, the LIA arithmetic unit 58, an FIA arithmetic unit 59, the alignment data memory unit 61, an EGA arithmetic unit 62, a memory unit 63, a shot area map data unit 64, a system controller 65, a wafer stage controller 66 and a reticle stage controller 67.

Referring to FIG. 4, the LSA arithmetic unit 57, the LIA arithmetic unit 58 and the FIA arithmetic unit 59 obtain wafer mark positions (i.e., coordinate positions on the rectangular coordinate system XY prescribed by the interferometer 15) on the basis of the photoelectric signals from the alignment sensor. The alignment data memory unit 61 is supplied with these coordinate positions. The position data stored in this memory unit 61 are properly supplied to the EGA arithmetic unit 62. The shot area map data memory unit 64 stores design array coordinate values of respective shot areas on the wafer W. This item of position data is also supplied to the EGA arithmetic unit 62. The EGA arithmetic unit 62 obtains six transform parameters a–f of a model function (the formula (1)) for calculating the coordinate positions of all the shot areas on the wafer W. This involves the use of a statistical method (e.g., the least squares method) on the basis of each of the coordinate values given from the memory units 61, 64. The thus obtained parameters a–f are supplied to the memory unit 63.

Further, the EGA arithmetic unit 62 calculates the respective coordinate positions of all the shot areas on the wafer W by use of the model function (the formula (1)) including the previously obtained transform parameters a–f. The thus calculated coordinate positions are supplied to the system controller 65. The system controller 65 determines a locating target position by adding a baseline quantity to the coordinate position given from the EGA arithmetic unit 62. The thus determined target position is sent to the stage controller 66. The stage controller 66 drives the wafer stage WS with the aid of the motor 16 so that a measured value of the laser interferometer 15 coincides with the target position. Each of the shot areas on the wafer W is thereby located in a predetermined exposure position (a projected position of the reticle pattern but, normally, an optical-axis position of the projection optical system 13) within the rectangular coordinate system XY. Note that the baseline quantity is defined as an interval between each of detection centers of the above FIA, LIA and LSA systems and the optical axis AX of the projection optical system 13, and the baseline quantity is measured beforehand by use of the ISS system. Moreover, the system controller 65 issues, to the stage controller 67, a drive command corresponding to a result of the measurement by two sets of the RA systems 10A, 10B or by the ISS system. The stage controller 67 drives the reticle stage RS by use of the motor 12 and executes locating of the reticle R while monitoring the measured value of the laser interferometer 11.

Figure 1:
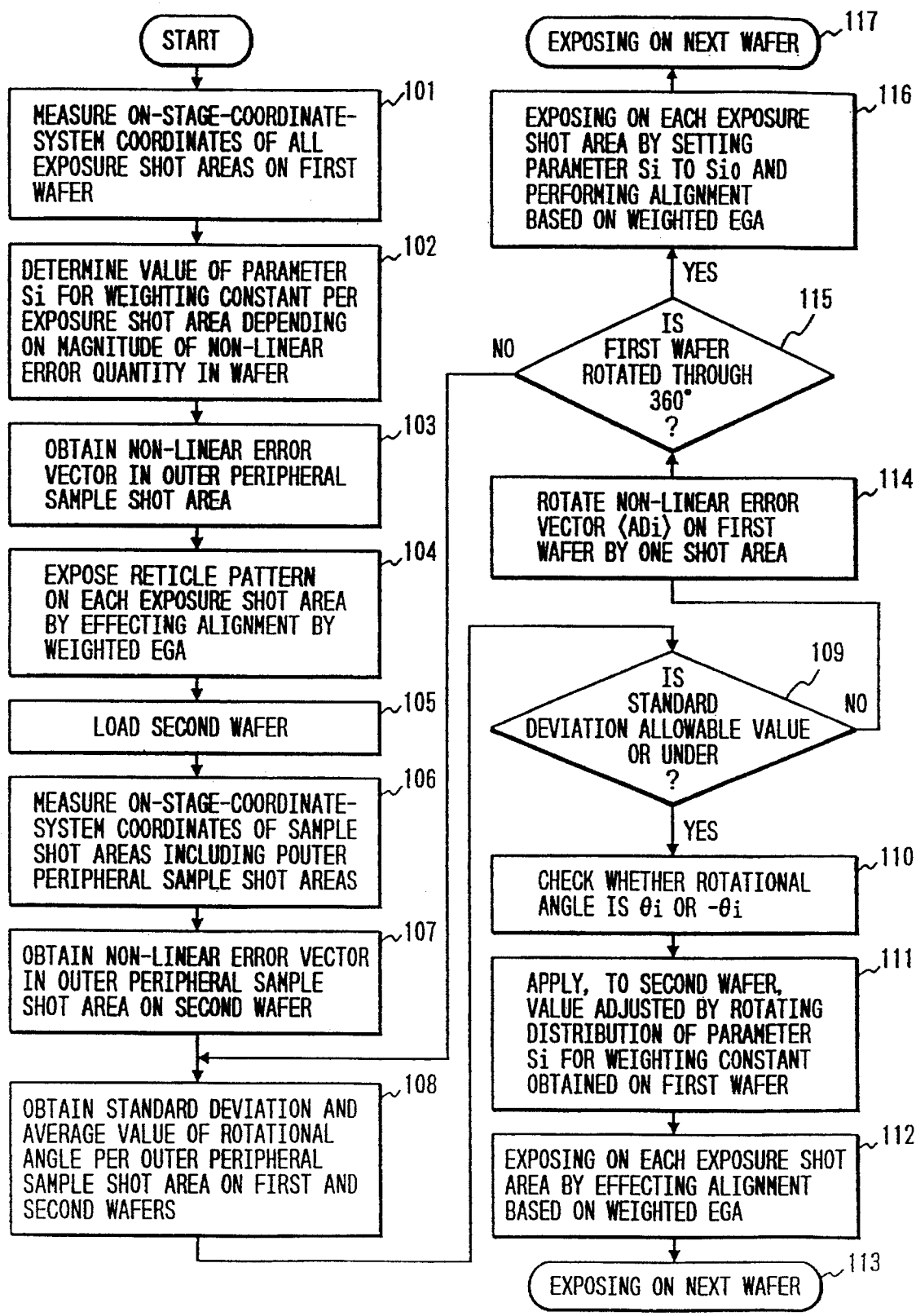
FIG. 1 is a flowchart showing an alignment method in accordance with a first embodiment of the present invention.
Figure 5A:
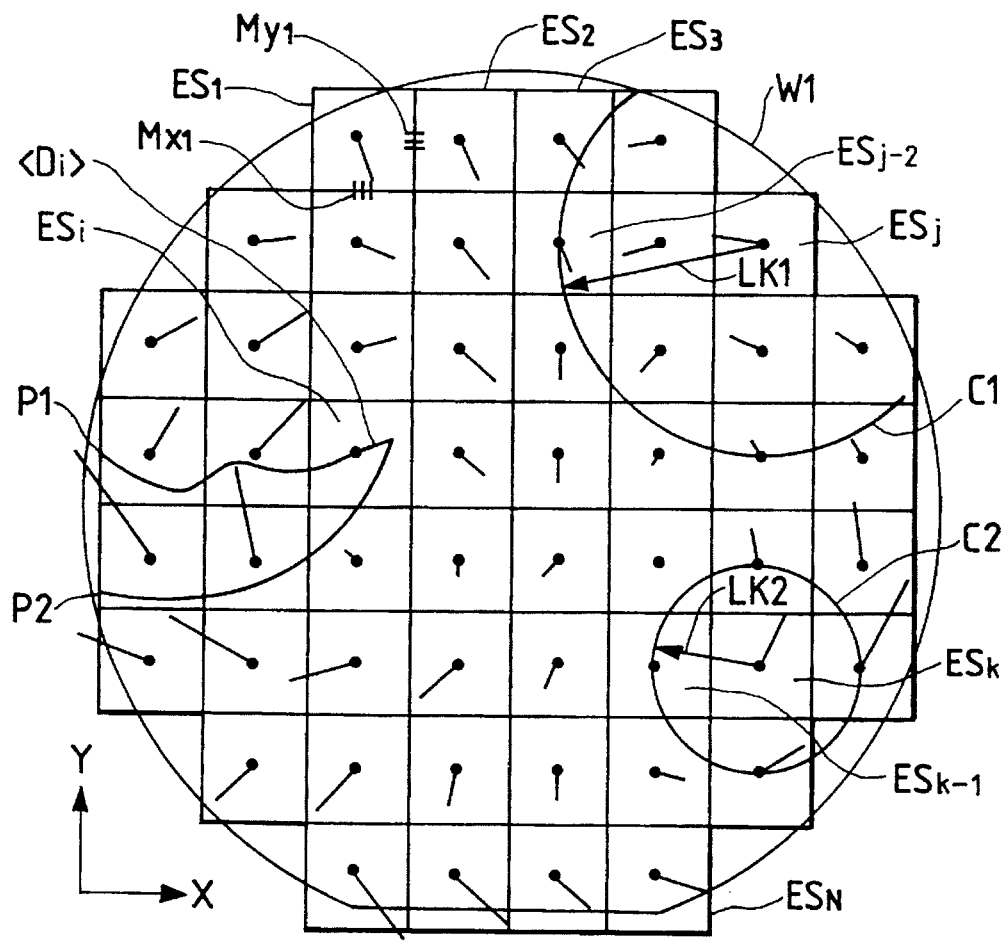
FIG. 5A is a diagram showing non-linear error quantities of shot areas on a wafer used in the first embodiment.

Given next is an explanation of the alignment method in the first embodiment of this invention with reference to FIG. 1. This embodiment will deal with a series of actions of effecting the position process per shot area with respect to a plurality of wafers in the same lot and projection-exposing pattern images of the reticle R. To start with, a first wafer W1 in the lot is loaded on the wafer stage WS. FIG. 5A illustrates an array of shot areas on the wafer used in this embodiment.

N-pieces of shot areas $ES_1$–$ES_N$ are regularly formed on the wafer W1 in accordance with a predetermined array coordinate system xy. A chip pattern is formed in each shot area by the exposure steps up to the previous layer. Further, shot areas ESi are sectioned by street lines having a predetermined width and extending in the X- and Y-directions. Each shot area is provided with two wafer marks Mxi, Myi. Turning to FIG. 5A, however, the illustrated wafer marks $Mx_1$, $My_1$ are put on only the shot area $ES_1$. Wafer marks Mxi are formed at centers of the X-directionally extended street lines which define the shot areas ESi. Wafer marks Myi are formed at the centers of the Y-directionally extended street lines which define the shot areas ESi. The wafer mark Mxi is configured by arranging three bar marks extending in the Y-direction at a predetermined interval. The wafer mark Myi is configured by rotating the wafer mark Mxi through 90°. Note that the array of shot areas and the shape of the wafer mark of the remaining wafers in the lot are the same with the wafer W1.

Now, in step 101 of FIG. 1, the system controller 65 detects the wafer marks with respect to all of N-pieces of the shot areas (hereinafter referred to as exposure shot areas) $ES_1$–$ES_N$ on which the reticle patterns on the first wafer W1 are to be exposed. This detection involves the use of two sets of FIA systems. The FIA arithmetic unit 59 obtains coordinate positions by performing waveform processing on the imaging signals SV transmitted from the FIA system for every wafer mark.

Figure 6:
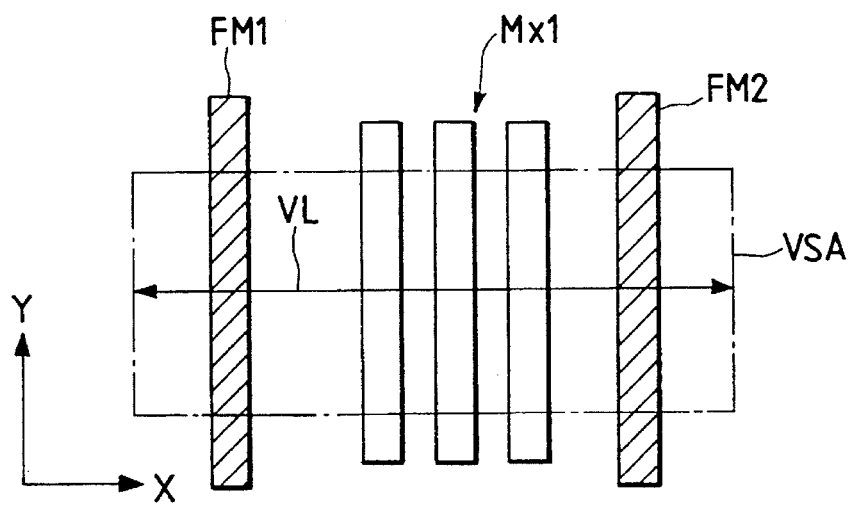
FIG. 6 is a diagram of assistance in explaining a method of detecting the alignment marks by an FIA system.

FIG. 6 illustrates a configuration of the wafer mark Mx1 detected by the X-FIA system of FIG. 2. The imaging device 34 supplies the FIA arithmetic unit 59 with the imaging signals SV. As shown in FIG. 6, the wafer mark Mx1 and fiducial marks FM1, FM2 exist in an imaging field VSA of the imaging device 34, wherein the wafer mark Mx1 is interposed between the fiducial marks FM1, FM2 formed on the fiducial plate 30. The imaging device 34 electrically scans images on the wafer mark Mx1 and the fiducial marks FM1, FM2 along a horizontal scanning line VL. On this occasion, the signal scanning line is disadvantageous in terms of an SN ratio, and, therefore, levels of the imaging signals obtained from a plurality of horizontal scanning lines within the imaging field VSA are added and averaged per pixel in the horizontal direction. The FIA arithmetic unit 59 effects the waveform-processing on these imaging signals and thus detects positional deviation quantities in the X-direction between the wafer mark Mx1 and the fiducial marks FM1, FM2. Thereafter, the FIA arithmetic unit 59 obtains the X-directional coordinate positions of the wafer mark Mx1 when the positional deviation quantities become zero by employing the position signals PDs transmitted from the interferometer 15. Further, the system controller 65 detects the wafer mark My1 of a sample shot area SA1 by using the Y-FIA system. The FIA arithmetic unit 59 obtains Y-directional coordinate positions thereof by performing the waveform-processing of the imaging signals thereof. Hereinbelow, X- and Y-directional coordinate positions thereof are obtained with respect to the sample shot areas $SA_2$–$SA_N$ by the same operations as the above-mentioned. The coordinate positions thereof are stored in the memory unit 61.

Figure 5B:
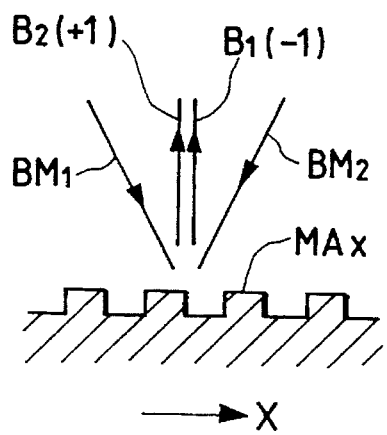
FIG. 5B is a diagram of assistance in explaining a method of detecting alignment marks by an LIA system.

FIG. 5B shows an example of a configuration of the wafer marks suitable for the LIA system. Referring to FIG. 5B, wafer marks MAx in the form of diffraction gratings are so formed as to be arrayed at a predetermined pitch in the X-direction. When detecting the wafer marks MAx, two laser beams $BM_1$, $BM_2$ from the LIA optical system 45 (FIG. 3) constituting an alignment sensor 17 fall on the wafer marks MAx. An intersecting angle between the two laser beams $BM_1$, $BM_2$ and the X-directional pitch of the wafer marks MAx are set to generate a–first-order diffracted light beam $B_1(-1)$ from the wafer mark MAx with respect to the laser beam $BM_1$ and a +first-order diffracted light beam $B_2(+1)$ from the wafer mark MAx with respect to the laser beam $BM_2$ in the same direction (the optical axis direction of the projection optical system 13 in this embodiment). The photoelectric detector 52 receives interference light beams of the–first-order diffracted light beams $B_1(-1)$ and the+ first-order diffracted light beam $B_2(+1)$ from the wafer marks MAx. The photoelectric detector 52 then supplies photoelectric signals SDw to the LIA arithmetic unit 58. The LIA arithmetic unit 58 calculates an X-directional positional deviation quantity of the wafer mark MAx from a phase difference between a reference signal SR and the photoelectric signal SDw. Thereafter, it follows that the LIA arithmetic unit 58 obtains coordinate positions of the wafer stage WS when the positional deviation quantity thereof becomes zero by use of the position signals PDs from the interferometer 15.

Figure 5C:
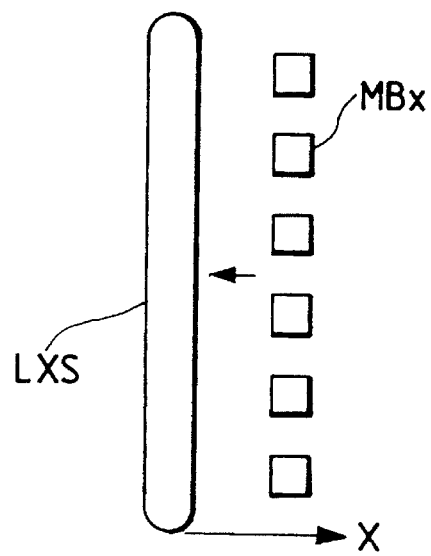
FIG. 5C is a diagram of assistance in explaining a method of detecting the alignment marks by an LSA.

FIG. 5C illustrates an example of a configuration of the wafer marks suitable for the LSA system. Referring to FIG. 5C, there is formed a wafer mark MBx consisting of six dot marks arrayed at a predetermined pitch in the Y-direction. When detecting the wafer mark MBx, the wafer W is irradiated with the laser beam from the LSA optical system 46 (FIG. 3) constituting the alignment sensor 17, viz., an elongate band-like spot beam LXS extending in the Y-direction. Then, the wafer stage WS is driven in the X-direction to perform relative scanning of the spot beam LXS with respect to the wafer mark MBx. The photoelectric detector 52 receives a diffracted light beam generated from the wafer mark MBx. The photoelectric signal SDi from the photoelectric detector 52 is supplied to the LSA arithmetic unit 57. The LSA arithmetic unit 57 obtains an X-directional coordinate position of the wafer mark MBx by predetermined arithmetic processing.

In step 102, EGA arithmetic unit 62 obtains the six transform parameters a–f in the formula (1) by using the coordinate position measured in step 101 on the basis of, e.g., the least squares method. Herein, a residual error component is expressed by the following formula:

$$\text{residual error component} = \sum_{n=1}^{N} \{(X_n - XM_n)^2 + (Y_n - YM_n)^2\} \quad (2)$$

where ($XM_n$, $YM_n$) is the coordinate position of the nth exposure shot area (sample shot area) $SA_n$ measured in step 101, and ($X_n$, $Y_n$) is the coordinate position obtained by substituting the design coordinate position into the formula (1).

Then, values of the transform parameters a–f in the formula (1) are obtained to minimize this residual error component. This is known as an EGA calculation.

Next, the EGA arithmetic unit 62 calculates each of the coordinate positions of N-pieces of the exposure shot areas $SA_1$–$SA_N$ by use of the model function (the formula (1)) containing the previously obtained transform parameters a–f. Further, the EGA arithmetic unit 62 subtracts the coordinate position obtained by the above-mentioned EGA calculation from the coordinate position ($XM_n$, $YM_n$) measured in step 101 per exposure shot area, thereby obtaining a difference therebetween as a non-linear error quantity. N-pieces of non-linear error quantities obtained herein are stored in the memory unit 63.

Referring herein to FIG. 5A, one example of the non-linear error quantity per exposure shot area is exaggeratedly displayed in the form of vector. In FIG. 5A, a non-linear error quantity of the exposure shot area ESi is expressed by a vector <Di>. A start point P1 of the non-linear error vector <Di> represents the previously calculated coordinate position (inclusive of a linear error quantity) of the exposure shot area ESi. A terminal point P2 of the vector <Di> represents the coordinate position, measured in step 101, of the exposure shot area ESi. Referring again to FIG. 5A, a non-linear error quantity of each of other exposure shot areas is expressed by a non-linear error vector.

Further, the N-pieces of exposure shot areas are classified into some groups in accordance with directions and magnitudes of the non-linear error vectors. Based on the thus classified groups, a weighting constant is determined per exposure shot area. A basic premise of a method of determining the weighting constant is that when calculating a coordinate position of an exposure shot area belonging to a certain group, a weight equal to or larger than a predetermined value is not applied to a coordinate position of an exposure shot area (a sample shot area) belonging to another group. Accordingly, the weighting constant given to another exposure shot area is set so that a large weight is not applied to a measured result (coordinate position) of the other exposure shot area in which a magnitude of the non-linear error vector is largely different from that of one exposure shot area.

To be specific, when aligning the nth exposure shot area ESi, a weight $W_{in}$ given to the exposure shot area (sample shot area) $SA_n$ is determined as shown in the following formula, wherein LKn is the distance from the exposure shot area ESi to the sample shot area $SA_n$. However, the parameter Si serves to change a degree of weighting.

$$W_{in} = \frac{1}{\sqrt{2\pi Si}} \exp\{-LKn^2/(2Si)\} \quad (3)$$

As obvious from the formula (3), the weight $W_{in}$ given to the measured result becomes larger with respect to the sample shot area having a greater distance LKn to the exposure shot area ESi. Further, the parameter Si is set to a smaller value with a shorter distance to the exposure shot area closest to the exposure shot area but exhibiting a different tendency of the non-linear error quantity among the exposure shot areas along the periphery of the exposure shot area ESi.

Referring to FIG. 5A, an exposure shot area $ES_{j-2}$ is the exposure shot area closest to an exposure shot area $ES_j$ but exhibiting a different tendency of the non-linear error quantity among the exposure shot areas along the periphery of the exposure shot area $ES_j$. An exposure shot area $ES_{k-2}$ is the exposure shot area closest to an exposure shot area $ES_k$ but exhibiting a different tendency of the non-linear error quantity among the exposure shot areas along the periphery of the exposure shot area $ES_k$. LK1 designates a distance between the exposure shot areas $ES_j$ and $ES_{j-2}$. LK2 is a distance between the exposure shot areas $ES_k$ and $ES_{k-1}$. Established is a relationship such as LK1>LK2. Hence, a value of the parameter Sj of the exposure shot area $ES_j$ is set larger than a value of a parameter Sk of the exposure shot area $ES_k$. This implies that the measured results of the sample shot areas disposed outwardly of a circle C1 having a radius LK1 are small in terms of weight with respect to the exposure shot area $ES_j$ and that the measured results of the sample shot areas disposed outside a circle C2 having a radius LK2 become small in terms of weight with respect to the exposure shot area $ES_k$.

Note that the value of the parameter Si is set in common to, e.g., $Si_0$ if non-linear distortion quantities are substantially equal over the entire surface of the wafer W1. In the formula (4), D is the weight parameter. The operator sets a value of the weight parameter D to a predetermined value, thereby automatically setting a parameter $Si_0$ and consequently the weight $W_{in}$ as well.

$$Si_0 = O^2/(8 \cdot \log_e 10) \quad (4)$$

This weight parameter D physically implies a range (hereinafter simply termed a [zone]) of the sample shot areas effective in calculating the coordinate positions of the exposure shot areas on the wafer. That is, if the zone is large, the number of the effective sample shots increases, and therefore, the result approximates to that obtained by the conventional EGA method. Whereas if the zone is small, the number of the effective sample shot areas decreases, and hence the result approximates to that obtained by the die-by-die method.

Further, the formula for determining the common parameter $Si_0$ is not limited to the formula (4). For instance, the following formula may be employed.

$$Si_0 = A/(m \cdot C) \quad (5)$$

where A [mm²] is the area of the wafer, m is the number of sample shot areas, and C is the correction coefficient (a positive real number).

This formula (5) is established so that an optimum value of the correction coefficient C to be used when determining the parameter $Si_0$ does not fluctuate so much by making variations in the wafer size and in the number of sample shot areas reflect in the determination of the parameter $Si_0$. If the correction coefficient C is small, the value of the parameter $Si_0$ becomes large, and, therefore the result approximates to that obtained by the conventional EGA method. Whereas if large, the value of the parameter $Si_0$ decreases, and hence the result approximates to that obtained by the die-by-die method.

In this embodiment, however, the value of the parameter Si is varied per exposure shot area in accordance with the non-linear distortion quantity on the wafer W1. When setting the value of the parameter Si, however, the value of the parameter $Si_0$ in the formula (4) or (5) is set as a reference value, and this reference value may be incremented or decremented.

Figure 7:
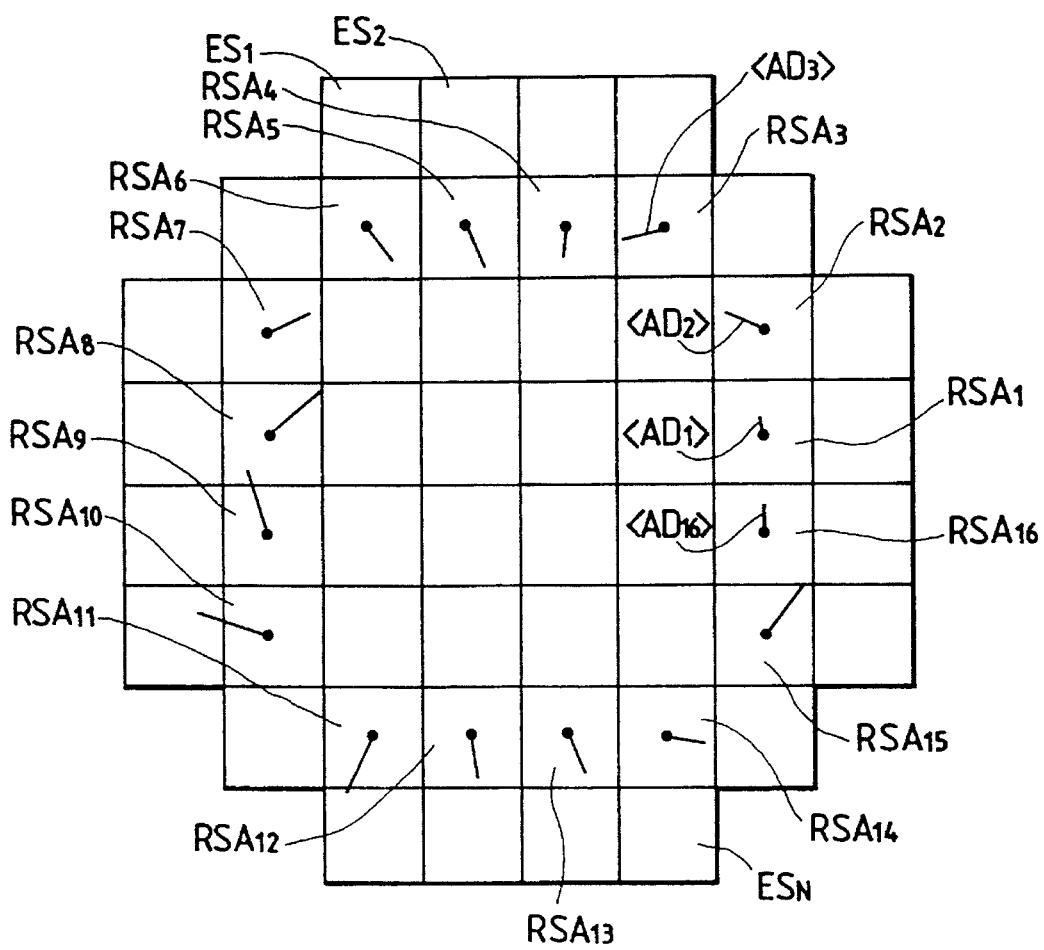
FIG. 7 is a diagram illustrating linear error vectors of sample shot areas in the vicinity of the outer periphery of a first wafer.

There are exposure shot areas (hereinafter called outer peripheral sample shot areas) existing along the periphery of the wafer but having substantially the same distance from the center of the wafer. Next, in step 103, a predetermined number of these outer peripheral sample shot areas are selected beforehand from all the exposure shot areas $ES_1$–$ES_N$ on the wafer W1 shown in FIG. 5A, whose coordinate positions on the stage coordinate system XY are measured. Turning to FIG. 7, sixteen outer peripheral sample shot areas $RSA_1$, $RSA_2$, ..., $RSA_{16}$ are selected in sequence counterclockwise substantially along a circle having a predetermined radius with respect to the center of the wafer. In this embodiment, there are obtained non-linear error vectors with elimination of the linear error quantities from those outer peripheral sample shot areas.

More specifically, there is obtained a sum of squares of differences between the coordinate positions measured in step 101 and the coordinate positions obtained by substituting the design coordinate position into the formula (1) with respect to the outer peripheral sample shot areas $RSA_1$–$RSA_{16}$ in the form corresponding to the formula (2). The transform parameters a–f in the formula (1) are obtained to minimize this sum of squares (a residual error component). Calculated further are respective coordinate positions of the outer peripheral sample shot areas $RSA_1$–$RSA_{16}$ by use of the model function (formula (1)) containing the thus obtained transform parameters a–f. Then, the non-linear error vector is obtained per outer peripheral sample shot area by subtracting the coordinate position calculated herein from the coordinate position measured in step 101. These non-linear error vectors are stored in the memory unit 63. FIG. 7 exaggeratedly illustrates non-linear error vectors $<AD_1>$, $<AD_2>$, $<AD_{16}>$ of the outer peripheral sample shot areas $RSA_1$, $RSA_2$, $RSA_{16}$. The following equations are established:

$$<AD_1> = (p1, q1)$$

$$<AD_2> = (p2, q2)$$

$$<AD_{16}> = (p16, q16) \quad (6)$$

where pi is the X-directional component of the non-linear error vector $<AD_i>$ of the ith outer peripheral sample shot area $RSA_i$, and qi is the Y-directional component thereof.

Calculated in next step 104 are the coordinate positions of all the exposure shot areas on the wafer W1 by the weighted EGA method. This involves the use of the weight $W_{in}$ calculated based on the parameter Si determined in step 102. The wafer W1 is located in accordance with the thus calculated coordinate positions, thus exposing the pattern of the reticle R on each exposure shot area. That is, all the exposure shot areas $ES_1$–$ES_N$ in FIG. 5A are set as sample shot areas with respect to the first wafer W1. When performing the alignment of an arbitrary exposure shot area ESi, the weight $W_{in}$ is allocated to each of N-pieces of sample shot areas $ES_1$–$ES_n$. Further, the residual error component Ei relative to the exposure shot area ESi is defined as expressed in the following formula by use of the coordinate position $(XM_n, YM_n)$ measured in step 101, the coordinate position $(X_n, Y_n)$ obtained by substituting the design coordinate position of the sample shot area into the formula (1) and the weight $W_{in}$ in the formula (3).

$$Ei = \sum_{n=1}^{N} W_{in}\{(X_n - XM_n)^2 + (Y_n - YM_n)^2\} \quad (7)$$

Then, values of the transform parameters a–f in the formula (1) are obtained to minimize this residual error component Ei. This is the weighted EGA calculation. Next, the EGA arithmetic unit 62 calculates the coordinate position of the exposure shot area ESi on the wafer W by using the model function (formula (1)) containing the thus obtained transform parameters a–f. Hereinafter, the EGA arithmetic unit 62 calculates the coordinate position of each of the exposure shot areas by obtaining the transform parameters a–f to minimize the residual error component Ei in the formula (3). Thereafter, the system controller 65 adds the baseline quantity of the FIA system to the coordinate position calculated by the EGA arithmetic unit 62. The system controller 65 thus corrects the coordinate position of each exposure shot area and outputs the corrected coordinate position (target position) to the stage controller 66. Then, the stage controller 66 sequentially locates the wafer stage WS in accordance with this inputted coordinate position, thus projection-exposing an image of the reticle pattern on each of all the exposure shot areas.

In next step 105, a second wafer W2 is loaded on the wafer stage WS. Measured further in step 106 are coordinate positions, on the stage coordinate system XY, of a plurality of sample shot areas selected from all the exposure shot areas on the wafer W2. The measured respective coordinate positions are stored in the memory unit 61.

Figure 8:
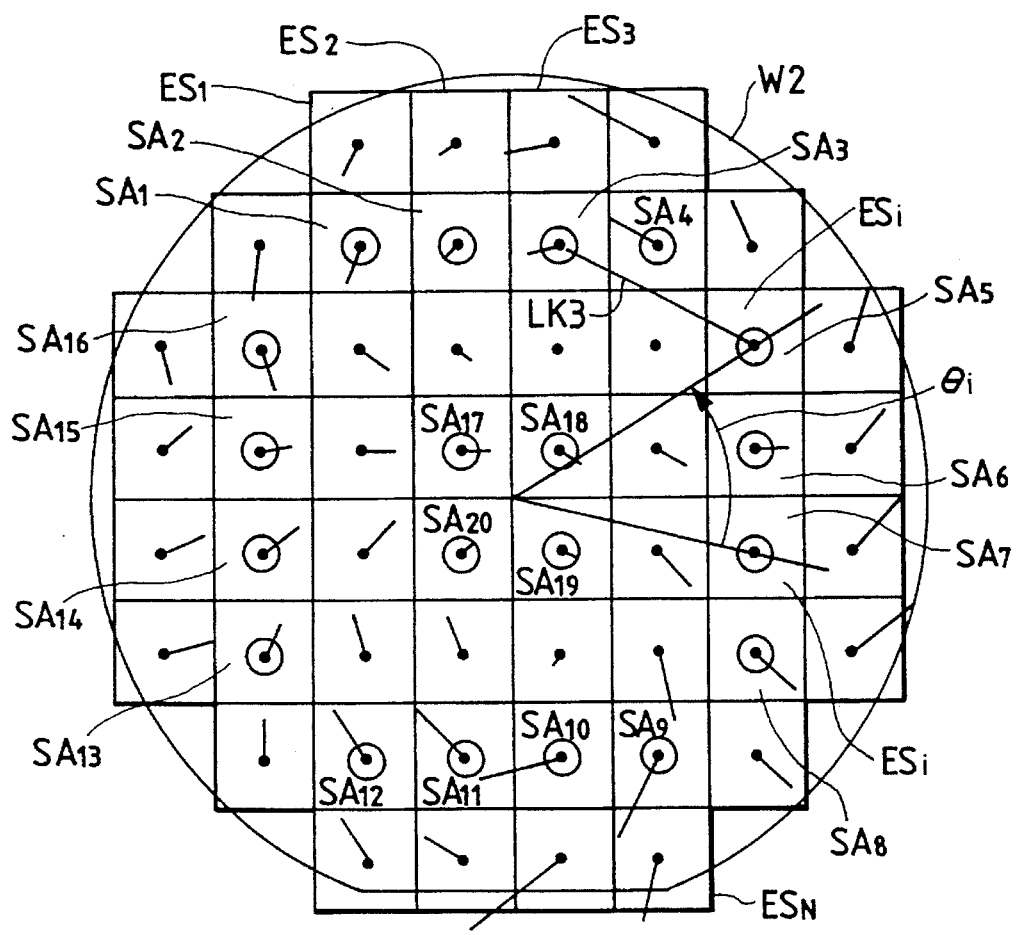
FIG. 8 is a diagram showing an array of sample shot areas on a second wafer and also non-linear error quantities of the respective shot areas.

FIG. 8 shows an array of shot areas on the second wafer W2. Referring to FIG. 8, the sample shot areas on the wafer W2 consist of 16 exposure shot areas $SA_1, SA_2, \ldots, SA_{16}$ arrayed substantially along a circumference having a predetermined radius about the wafer center and 4 exposure shot areas $SA_{17}, \ldots, SA_{20}$ in the vicinity of the wafer center. The twenty sample shot areas $SA_1$–$SA_{20}$ include outer peripheral alignment shot areas $RSA_1$–$RSA_{16}$ on the first wafer W1 shown in FIG. 7 and are adapted to perform the weighted EGA method. This is intended to be an application of the weighted EGA method after checking whether or not the tendencies of the non-linear error vectors are the same with respect to the first and second wafers W1, W2.

Further, the EGA calculations are conducted with respect to only the sample shot areas $SA_{1-SA20}$ as in the same way with step 102. Non-linear error quantities of all the sample shot areas are obtained by subtracting the coordinate positions calculated by use of the transform parameters a–f obtained by the EGA calculations from the coordinate positions of the sample shot areas SAi measured in step 101. These non-linear error quantities are supplied to the memory unit 63.

Figure 9:
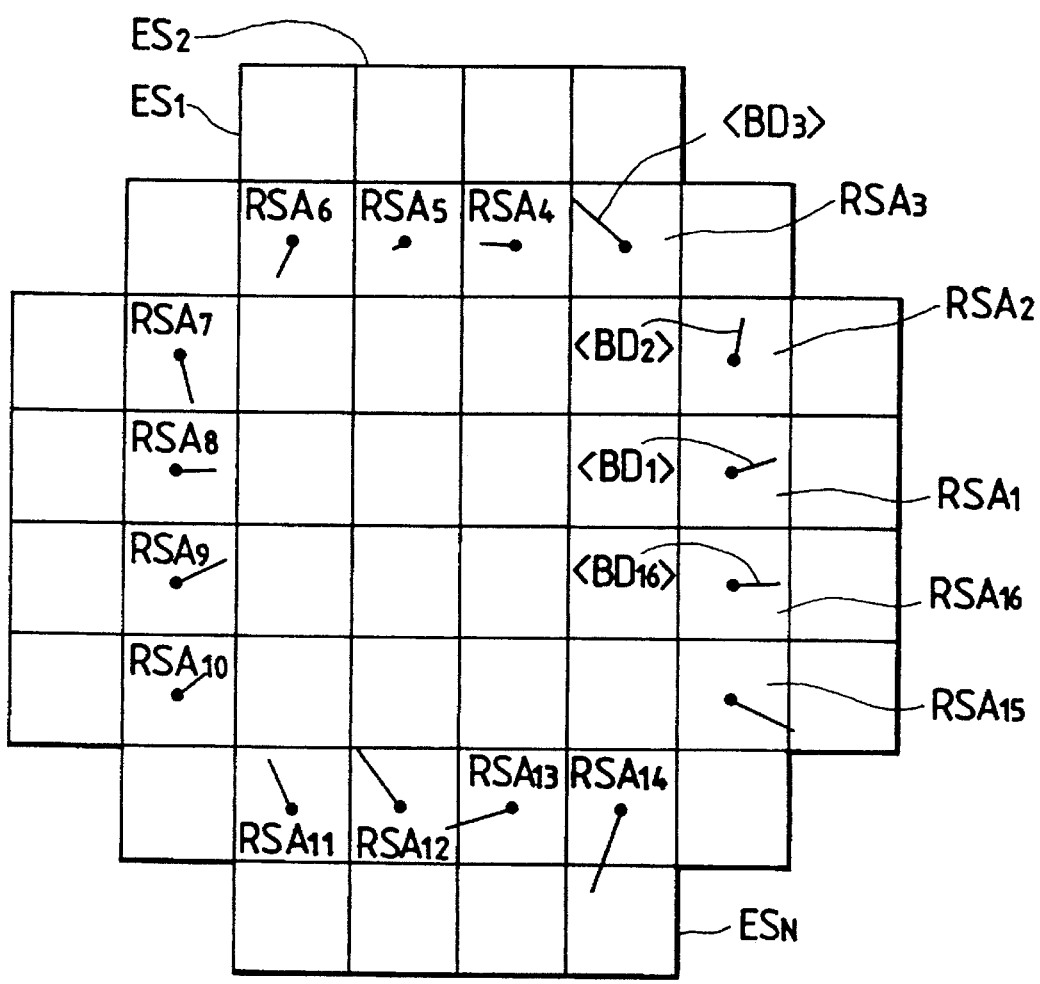
FIG. 9 is a diagram showing the linear-error vectors of the sample shot areas in the vicinity of the outer periphery of the second wafer.

In next step 107, the non-linear error vector with an elimination of the linear error quantity is also obtained from each of the 16 outer peripheral sample shot areas among the sample shot areas $SA_1$–$SA_{20}$ of FIG. 8. The thus obtained non-linear error vectors are stored in the memory unit 63. FIG. 9 illustrates an array of the outer peripheral sample shot areas on the second wafer W2. Referring to FIG. 9, the outer peripheral sample shot areas $RSA_1$–$RSA_{16}$ are arrayed counterclockwise substantially along a circle having a predetermined radius from the wafer center. The outer peripheral sample shot areas on the wafer W2 are set in the same array as that of the outer peripheral sample shot areas on the first wafer W1 shown in FIG. 1.

FIG. 9 exaggeratedly illustrates non-linear error vectors $<BD_1>, <BD_2>, <BD_{16}>$ of the outer peripheral sample shot areas $RSA_1, RSA_2, RSA_{16}$ on the wafer W2. The following equations are established:

$$<BD_1>=(x1, y1)$$

$$<BD_2>=(x2, y2)$$

$$<BD_{16}>=(x16, y16) \qquad (8)$$

where xi is the X-directional component of the non-linear error vector $<BDi>$ of the ith outer peripheral sample shot area RSAi, and yi is the Y-directional component thereof.

Next, in step 108, whether or not the tendency of the non-linear error vector on the first wafer W1 can be regarded as identical with the tendency of the non-linear error vector on the second wafer W2 is confirmed by rotating the wafers. For this purpose, the following operations are carried out. To start with, a cosine $\cos\theta i$ of a rotating angle $\theta i$ of the non-linear error vector $<BDi>$ of the ith outer peripheral sample shot area RSAi on the wafer W2 is obtained based on the non-linear error vector $<ADi>$ of the ith outer peripheral sample shot area RSAi on the wafer W1 by the following formula ($1 \leq i \leq 16$). This involves the use of the non-linear error vector components (p1, q1)–(p16, q16) of the outer peripheral sample shot areas $RSA_1$–$RSA_{16}$ on the first wafer W1 and the non-linear error vector components (x1, y1)–(x16, y16) of the outer peripheral sample shot areas $RSA_1$–$RSA_{16}$ on the second wafer W2.

Then, an average value of sixteen values of $\cos\theta i$ and a standard deviation ($\sigma$ or $3\sigma$) are obtained. Thereafter, $$\cos\theta i = \frac{<ADi>\cdot<BDi>}{|<ADi>|\cdot|<BDi>|} \qquad (9)$$

$$= \frac{xi\cdot pi + yi\cdot qi}{\sqrt{xi^2+yi^2}\sqrt{pi^2+qi^2}}$$

in step 109, whether or not the standard deviation of $\cos\theta i$ is not more than a predetermined allowable value is checked. Subsequently, if the standard deviation is the allowable value or under, in step 110, there are obtained non-linear error vectors $<AD_{i+}>$ and $<AD_{i-}>$ corresponding to the respective outer peripheral sample shot areas RSAi on the wafer W2 of FIG. 9 when rotating the first wafer W1 through rotating angles $\theta i$, $-\theta i$. Then, the standard deviation of the cosine $\cos\theta i$ is obtained once again by substituting the non-linear error vectors $<AD_{i+}>$, $<AD_{i-}>$ instead of the vector $<AD_i>$ into the formula (9). Further, the rotating angle $\theta i$ or $-\theta i$ when this standard deviation is the above allowable value or under is reset to the rotating angle $\theta i$. In this case, it is considered that the non-linear error vector on the first wafer W1 is overlapped with the non-linear error vector on the second wafer W2 by rotating the first wafer W1 through the angle $\theta i$.

Then, the operation shifts to step 111, wherein the first wafer W1 is rotated counterclockwise through only the rotating angle $\theta i$. A parameter Sj serves to determine a weight $W_{jn}$ in the formula (3) which is set to each of exposure shot areas $ES_j$ on the wafer W1 after being rotated, the shot areas $ES_j$ being disposed substantially in the same positions of the exposure shot areas $ES_i$ on the second wafer W2. The parameter $S_j$ is allocated to each of sample shot areas $SA_n$ on the wafer W2. However, twenty sample shot areas are provided on the second wafer W2 (see FIG. 8). The N-pieces of sample shot areas, i.e., the total number of exposure shot areas, are provided on the first wafer W1. Hence, a parameter obtained by varying the value of the parameter Sj is employed as a parameter Si' of each of the exposure shot areas ESi on the second wafer W2, thus making available the measured results of the sample shot areas in a wider zone than in the case of the first wafer W1. The parameter Si' is substituted as a parameter Si in the formula (3), thereby obtaining a weight Win allocated to each of sample shot areas $SA_n$ of FIG. 8 when performing the alignment of each of the exposure shot areas ESi on the wafer W2.

Thereafter, in step 112, the respective exposure shot areas ESi on the wafer W are aligned by the weighted EGA method. The patterns of the reticle R are respectively exposed. That is, when aligning each of the exposure shot areas ESi, a residual error component Es' is expressed by the following formula on the basis of the previously measured coordinate position $(XM_n, YM_n)$ of the sample shot area $SA_n$, the coordinate position $(X_n, Y_n)$ obtained by substituting the design coordinate position into the formula (1) and the weight $W_{in}'$. In the following formula, m has a value of 20.

$$Ei' = \sum_{n=1}^{m} W_{in}'\{(X_n-XM_n)^2+(Y_n-YM_n)^2\} \qquad (10)$$

Then, the transform parameters a–f in the formula (1) are obtained to minimize this residual error component Ei'. The coordinate position of the exposure shot area ESi is calculated by use of the model function (formula (1)) containing the thus obtained transform parameters a–f. The exposure shot area ESi is aligned and exposed based on the calculated coordinate position. When finishing the exposures on all of the exposure shot areas on the wafer W2, the operation shifts to step 113, and the exposing process on the next wafer will be conducted.

On the other hand, in step 109, if the standard deviation of the value of cosθi is a predetermined allowable value or above, the operation shifts to step 114 wherein the non-linear error vector <ADi> (1≦i≦16) of the first wafer W1 of FIG. 7 is rotated counterclockwise by one shot area. Further, in step 115, whether the rotating angle reaches 360° or not is checked. If the rotating angle is not larger than 360°, the operation goes back to step 108, wherein the cosine cosθi in the formula (9) is again calculated by employing a new non-linear error vector <ADi'> after being rotated. Thus, an average value and a standard deviation of cosθi are obtained. Steps 109, 114, 115, 108 are repeated till the standard deviation comes to the predetermined allowable value or under. When the standard deviation becomes the allowable value or under, the operation shifts to step 110.

For instance, when the non-linear error vector <ADi> on the wafer W1 of FIG. 7 is rotated counterclockwise by four shot areas, all the cosines cosθi with respect to the non-linear error vectors <ADi'> after being rotated and the non-linear error vectors <BDi> on the wafer W2 of FIG. 9 are substantially zero. When the wafer W1 of FIG. 7 is rotated counterclockwise through 90°, the non-linear error vector after being rotated is overlapped with the non-linear error vector on the wafer W2 of FIG. 9.

On the other hand, even when the non-linear error vector <ADi> of FIG. 7 is rotated counterclockwise through 360°, and if the standard deviation of cosθi does not come to the predetermined allowable value or under, it is considered that the distortion tendency of the array error of the first wafer W1 is different from that of the second wafer W2. Hence, the operation shifts from step 115 to step 116. Then, the weight $W_{in}'$ is set by using the parameter $Si_0$ in, e.g., the formula (4) or (5) as a parameter $Si$ of each exposure shot area ESi on the second wafer W2. Moreover, the alignment is effected based on the weighted EGA method by employing this weight $W_{in}'$, thereby exposing the pattern image of the reticle R on each of the exposure shot areas ESi. In connection with the wafer W2, however, as in the same way with the first wafer W1, a weight is newly obtained per exposure shot area by measuring the coordinate position of all the exposure shot areas, and the alignment may be performed based on the weighted EGA method by use of this weight. Subsequently in step 117, the exposure on the next wafer is carried out.

Note that the weight $W_{in}$ is determined from the formula (3) in accordance with the parameter $Si$ in this embodiment, however, there may be employed a weight $W_{in}''$ obtained by the following calculation formula according to the parameter $Si$. In this case, let $LEi$ be the distance (radius) between a wafer variant central point (e.g., a center of point symmetry of a non-linear distortion), e.g., the wafer center and the exposure shot area ESi on the wafer. Let $LW1$–$LWm$ be distances (radii) between the wafer center and m-pieces (m=20 in FIG. 8) of sample shot areas $SA_1$–$SA_m$. Then, the weight $W_{in}''$ defined by the following formula may be given to each of measured results of the m-pieces of sample shot areas $SA_1$–$SA_m$ in accordance with the distance $LEi$ and the distances $LW1$–$LWm$.

$$W_{in}'' = \frac{1}{\sqrt{2\pi Si}} \exp\{-(LEi - LWn)^2/(2Si)\} \quad (11)$$

Figure 10:
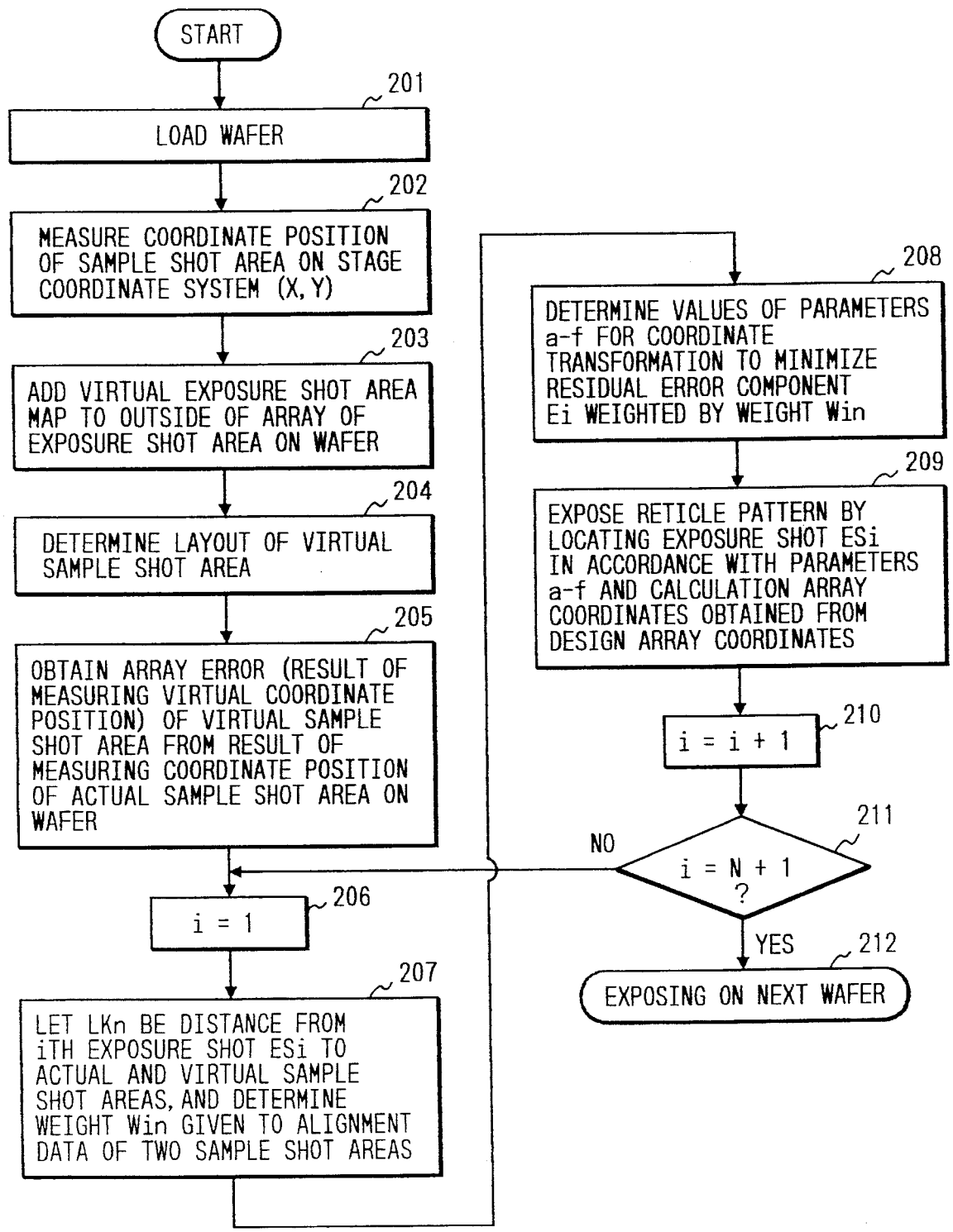
FIG. 10 is a flowchart showing an alignment method in a second embodiment of this invention.
Figure 11:
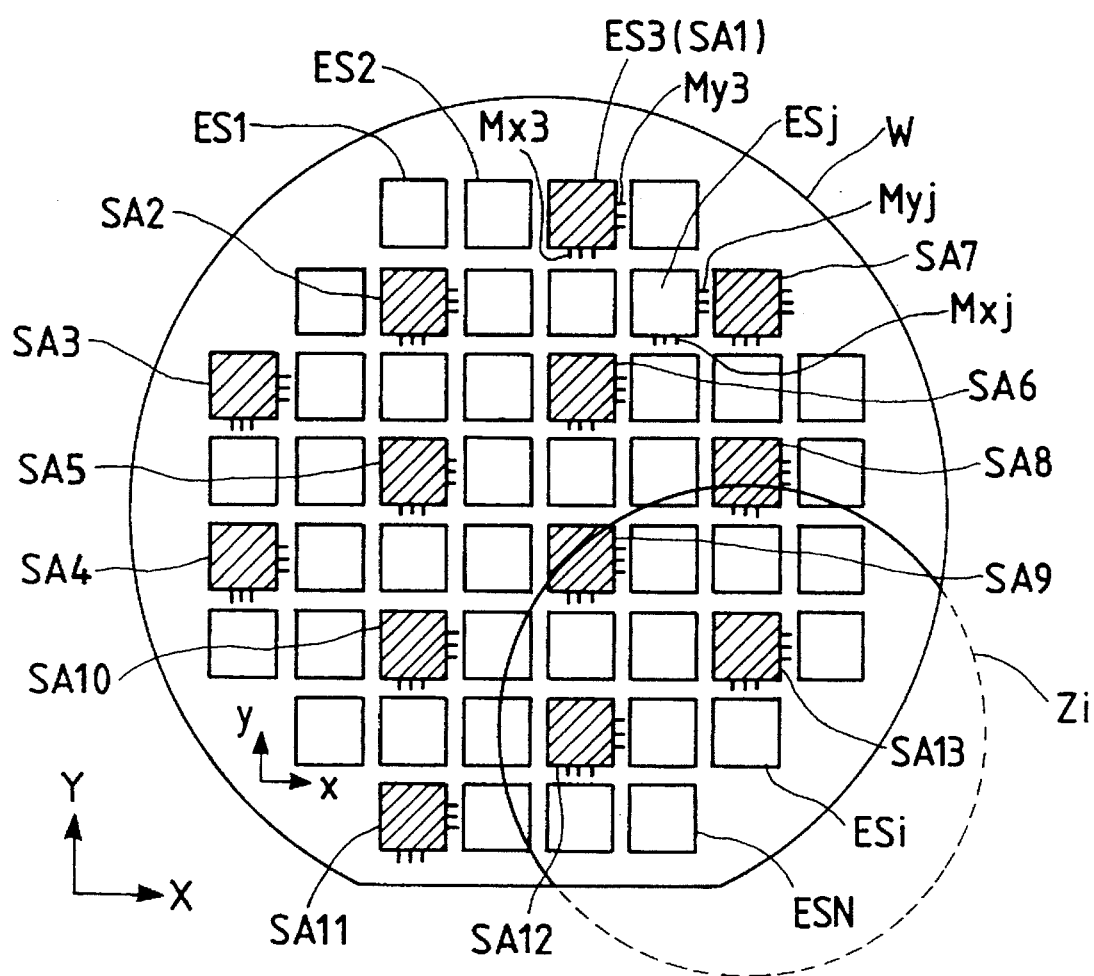
FIG. 11 is a diagram illustrating a layout of the sample shot areas on the wafer employed in the second embodiment.

Next, the alignment method in accordance with a second embodiment of the present invention will be discussed with reference to FIG. 10. Given in this embodiment is an explanation of a series of operations of projection-exposing the pattern image of the reticle R by locating each of a plurality of exposure shot areas on the signal wafer. At first, in step 201, the wafer W of FIG. 11 is loaded on the wafer stage WS. FIG. 11 illustrates an array of the shot areas on the wafer W employed in this embodiment. The description thereof is omitted because of the wafer W having basically the same configuration with the wafer W1 of FIG. 5A.

In next step 202, coordinate positions on the stage coordinate system XY are measured absolutely in the same manner with the first embodiment with respect to each of thirteen sample shot areas SA1–SA13 selected among all of the exposure shot areas on the wafer W in this embodiment. The respective coordinate positions are supplied to the EGA arithmetic unit 62 via the memory unit 61. The sample shot areas SA1–SA13 are distributed with a substantially uniform density on the wafer W, or alternatively, the great majority of these sample shot areas are distributed somewhat along the periphery of the wafer W.

Referring herein to FIG. 11, for example, the number of the sample shot areas within a circular zone Zi having a predetermined radius about the exposure shot area ESi existing on the periphery of the wafer W is smaller than the number of the sample shot areas within a circular zone having the same radius with that of the zone Zi about the exposure shot area existing in the vicinity of the center of the wafer W. For this reason, for instance, when imparting a weight to each of the coordinate positions (hereinafter referred to as alignment data) of the previously measure sample shot areas SA1–SA13 in accordance with the distances from the respective exposure shot areas, there decreases the number of the sample shot areas making an effective contribution to the use for coordinate calculations with respect to the exposure shot areas ESi existing along the periphery of the wafer W. Then, the following virtual sample shot areas are introduced in this embodiment.

Figure 12:
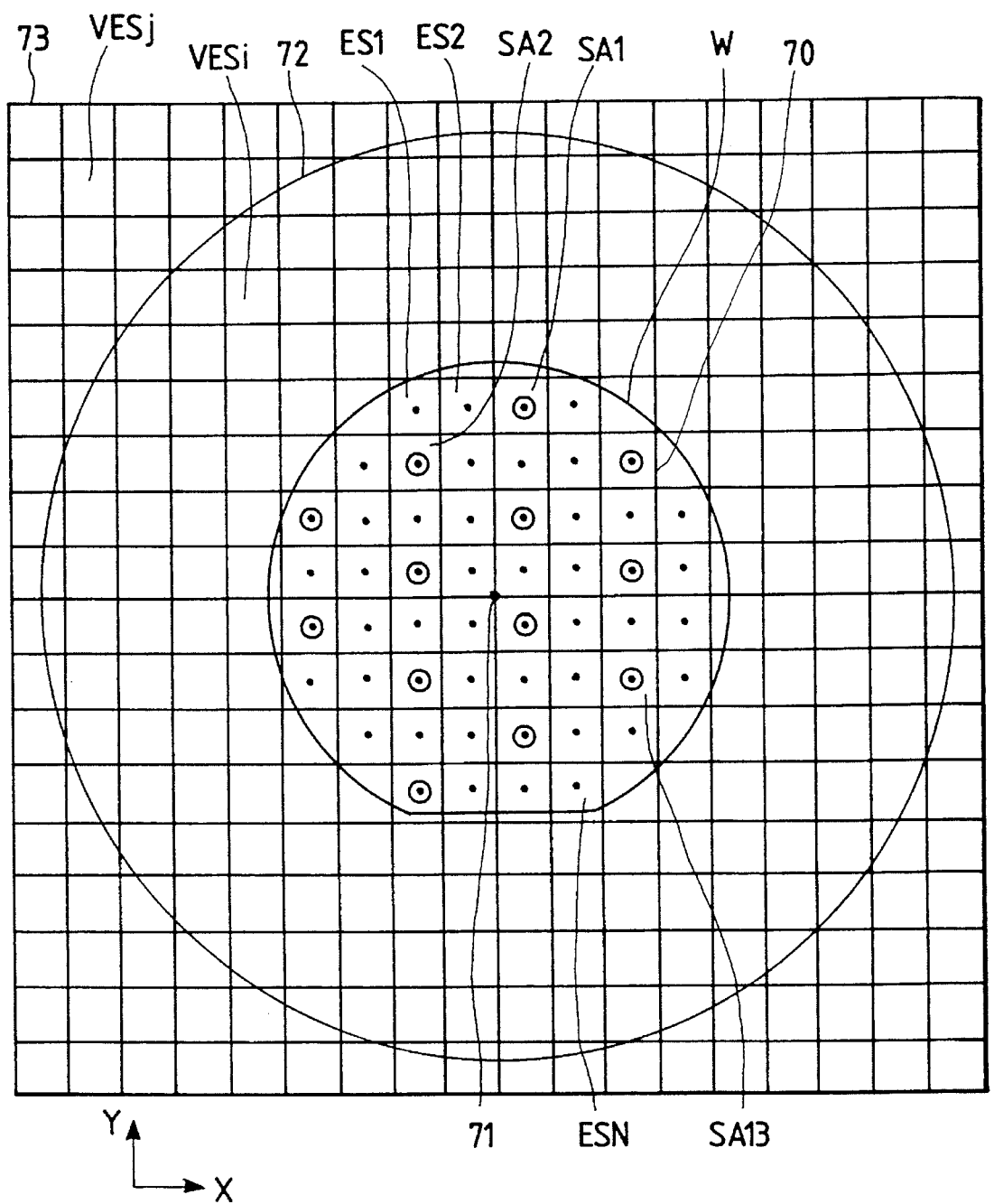
FIGS. 12 and 13 are diagrams each showing one example of a virtual exposure shot area map.

Subsequently in step 203 of FIG. 10, an array of the virtual exposure shot areas (a virtual exposure shot area map) is added to the outside of an array of exposure shot areas ES1–ESN on the wafer W. FIG. 12 shows one example of the virtual exposure shot area map added to the wafer W. Shown in FIG. 12 is a zone 70 where the exposure shot areas are arrayed on the wafer W. In FIG. 12, however, a street line zone for sectioning the exposure shot areas in FIG. 11 is omitted. This is the same with FIGS. 13, 15 and 16 which follow. Then, a circular zone 72 having a radius that is several times (twice in FIG. 12) as large as the radius of the wafer W is set about a center 71 of the wafer W. A zone existing outwardly of the zone 70 but inwardly of the zone 72 is set as a virtual exposure shot area map. This virtual shot area map is segmented in the X- and Y-directions at the same pitches as those of the interior of the zone 70. Each of the thus segmented rectangular areas turns out an exposure shot area VESi.

However, the virtual exposure shot area map may involve the use of a zone existing outwardly of the zone 70 but inwardly of a rectangular zone 73 in which maximum values of the numbers of X- and Y-directional shot areas of the zone 70 are respectively set several times (twice in FIG. 12). In this case also, a virtual exposure shot area VESj is one of individual rectangular areas into which the zone is segmented in the X- and Y-directions at the same pitches as those of the interior of the zone 70.

Next, in step 204, virtual sample shot areas (hereinafter termed virtual sample shot areas) are disposed based on a predetermined rule in the virtual exposure shot area map existing outwardly of the zone 70 in which the exposure shot areas of the wafer W are arrayed. The predetermined rule is, it is considered, that a predetermined number of virtual sample shot areas are arrayed on a plurality of straight lines passing through the center 71 of the wafer W; or alternatively, the virtual sample shot areas are arrayed on the straight lines passing through two or more sample shot areas among the original sample shot areas SA1–SA13.

Figure 13:
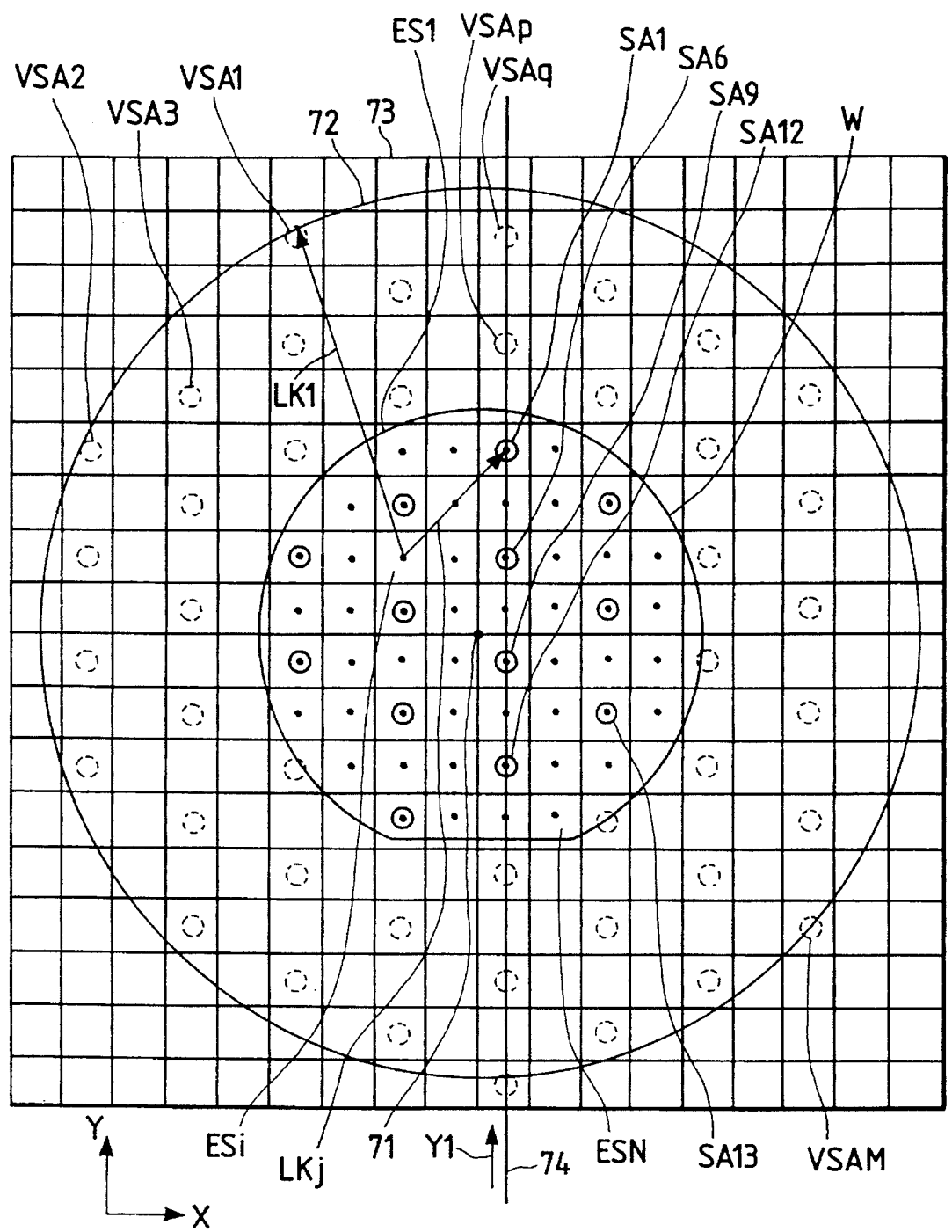

FIG. 13 illustrates one example of the array of the virtual sample shot areas. Referring to FIG. 13, virtual sample shot areas VSA1, VSA2, VSA3, ..., VSAM are arrayed in the X- and Y-directions at the same pitches as those of the original sample shot areas SA1–SA13 on the wafer W in the virtual exposure shot area map existing internally of the circular zone 72. The sample shot areas SA1–SA13 in this embodiment are arrayed along a group of straight lines substantially parallel to the Y-axis and a group of straight lines intersecting the X-axis at a predetermined angle. Hence, each of the virtual sample shot areas VSA1–VSAM is always positioned on the straight line passing through the two or more sample shot areas among the sample shot areas SA1–SA13.

Next, in step 205, virtual coordinate positions (virtual array errors), on the stage coordinate system XY, of the virtual sample shot areas VSA1–VSAM are estimated based on the respective coordinate positions of the sample shot areas SA1–SA13 on the wafer W which have been measured in step 202. Given hereinbelow is an explanation of one specific example of a method of estimating virtual coordinate positions of virtual sample shot areas VSAp, VSAq of FIG. 13. In this case, the virtual sample shot areas VSAp, VSAq are respectively centered on a straight line 74 passing through each of centers of four sample shot areas SA1, SA6, SA9, SA12 on the wafer W. A coordinate Y1 is taken on this straight line 74.

Figure 14:
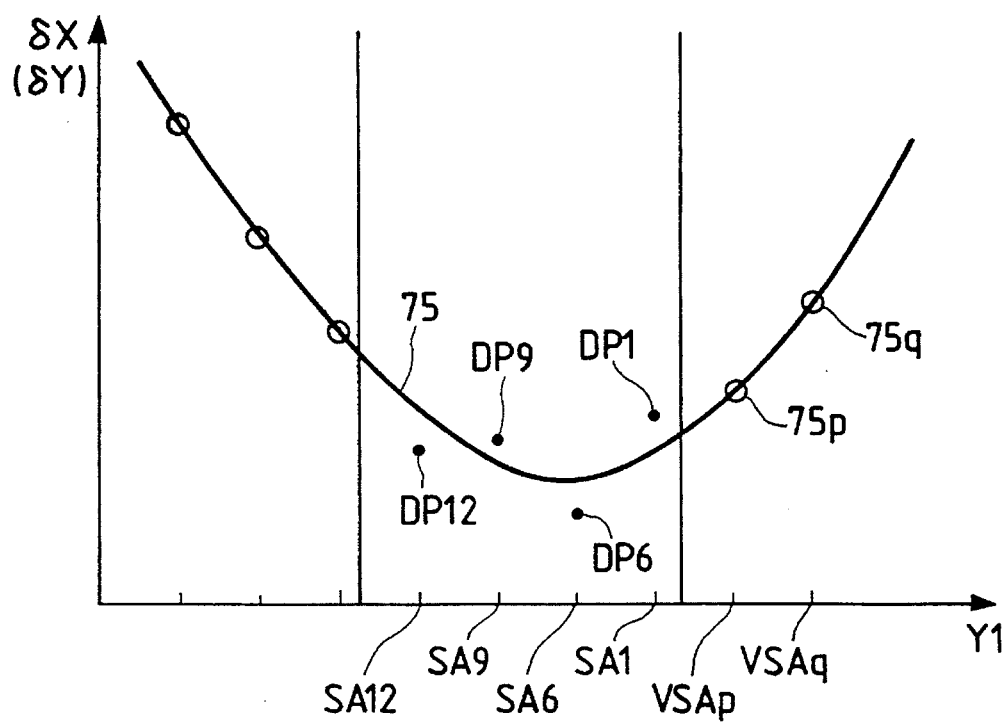
FIG. 14 is a diagram showing one example of an approximate curve of an array error.

Then, an array error δX is plotted with respect to the coordinate Y1, wherein the array errors δX are obtained by subtracting X-components of the design coordinate positions from X-components of the measured coordinate positions of the sample shot areas along the straight line 74. As shown in FIG. 14, points DP1, DP6, DP9, DP12 are obtained. In FIG. 14, the axis of abscissa indicates the coordinate Y1, while the axis of ordinates indicates the array error δX. The array errors of the points DP1, DP6, DP9, DP12 indicate array errors of the sample shot areas SA1, SA6, SA9, SA12. Obtained by applying the least squares method in this embodiment is a kth-order curve 75 of the coordinate Y1, wherein a sum of remainders with respect to the points DP1, DP6, DP9, DP12 is minimized. A value of k is, e.g., 2 or 3. Obtained subsequently are values of the array errors δX of points 75p, 75q at which the Y1-coordinate correspond to the virtual sample shot areas VSAp, VSAq on the kth-order curve 75. The X-components of the design coordinate positions are added to these array errors, thereby obtaining the X-components of the virtual coordinate positions of the virtual sample shot areas VSAp, VSAq. Note that the respective array errors are, as a matter of fact, obtained not by plotting the kth-order curve 75 as shown in FIG. 14 but by substituting the coordinate positions of the virtual sample shot areas into kth-order approximate functions of the coordinate Y1. The same graph as FIG. 14 is similarly formed. This involves plotting, with respect to the coordinate Y1, the array errors obtained by subtracting Y-components of the design coordinate positions from Y-components of the measured coordinate positions of the sample shot areas along the straight line 74 of FIG. 13. Accordingly, the Y-components of the virtual coordinate positions of the virtual sample shot areas VSAp, VSAq are obtained in the same way with the X-components. Further, virtual coordinate positions of other virtual sample shot areas are similarly obtained.

Figure 15:
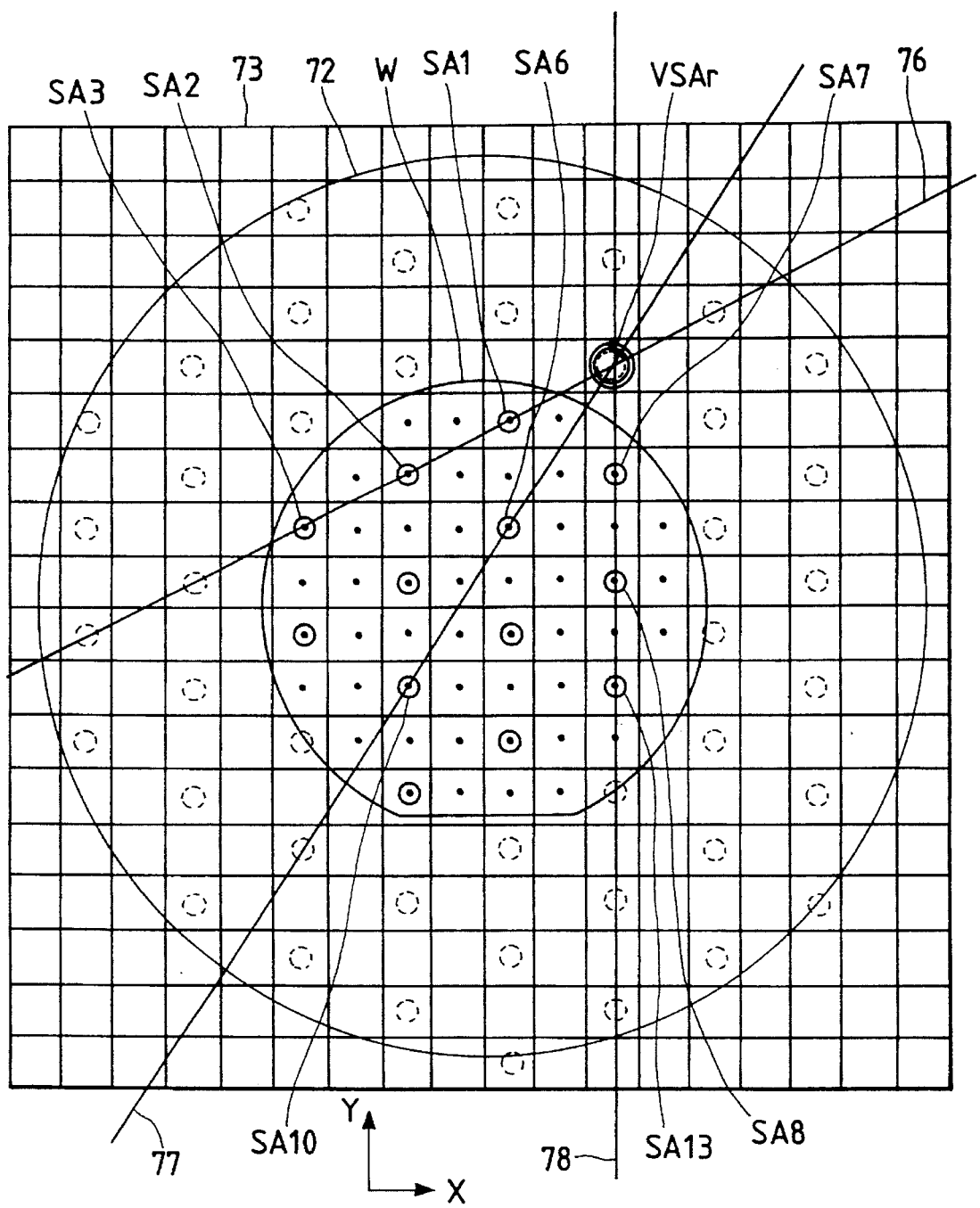
FIG. 15 is a diagram showing virtual sample shot areas on intersections of three straight lines passing through a plurality of sample shot areas.

Note that three approximate expressions can be prepared for obtaining the array error with respect to a virtual sample shot areas VSAr existing at an intersection of the three straight lines 76, 77, 78 passing through the two or more sample shot areas as illustrated in FIG. 15. In this case, the approximate expression is prepared only from data along a straight line having the maximum number of the on-wafer sample shot areas arranged on the straight line. The array errors in the position of the virtual sample shot may be obtained from this approximate expression. Alternatively, all the approximate expressions that can be prepared are obtained, and an average value (a weighted mean value is also available) of the array errors of the virtual sample shot areas which is obtained from each approximate expression may be used as an array error of the virtual sample shot area VSAr.

After obtaining all the measured results (virtual alignment data) of the virtual coordinate positions of the virtual sample shot areas, each of the exposure shot areas ES1–ESN on the wafer W is aligned and exposed. For this purpose, a variable i is initialized to 1 in step 206. The exposure shot area ESi is aligned in step 207. On this occasion, there are set weights applied to the alignment data of the sample shot areas SA1–SA13 and the virtual alignment data of the virtual sample shot areas VSA1–VSAM.

In this instance, as illustrated in FIG. 13, there is calculated a distance LK1 between the center of the ith exposure shot area ESi and the center of the first virtual sample shot area VSA1. Calculated then is a distance LKj from the exposure shot areas ESi to the sample shot area SA1. Hereinbelow, there are individually calculated distances from the exposure shot area ESi to all the virtual and actual sample shot areas. Then, all the virtual and actual sample shot areas VSA1–VSAM and SA1–SA13 are in turn conceived as (M+13) pieces of sample shot areas. Let LKn be the distance from the exposure shot areas ESi to the nth sample shot area, and the weight $W_{in}$ given to the alignment data (including the virtual alignment data) of each sample shot area is determined as a function of the distance LKn as expressed by the following formula.

$$W_{in} = \frac{1}{\sqrt{2\pi S}} \exp\{-LKn^2/(2S)\} \quad (12)$$

In the formula (12), the parameter S is a parameter for changing a degree of weighting. As obvious from this formula, the weight $W_{in}$ given to the alignment data becomes large according as the sample shot area has a smaller distance LKn to the exposure shot area ESi.

Next, in step 208, the EGA arithmetic unit 62 obtains values of the six transform parameters a–f in the formula (1) on the basis of the weight Win in the formula (12), the design coordinate positions of the sample shot areas (including the virtual sample shot areas) and the alignment data. That is, the shot area number N in the above-stated formula (7) is set such as N=m (=M+13), and the transform parameters a–f in the formula (1) are obtained to minimize the residual error component Ei of the formula (7).

Next, in step 209, the EGA arithmetic unit 62 calculates the coordinate position of the exposure shot area ESi on the stage coordinate system XY by substituting the transform parameters a–f obtained in step 208 and the design coordinate position of the exposure shot area ESi into the formula (1). The EGA arithmetic unit 62 supplies each coordinate position to the system controller 65. Further, the system controller 65 locates the wafer stage WS in accordance with a coordinate position obtained by adding a baseline quantity to the coordinate position calculated by the EGA arithmetic unit 62. Thereafter, the pattern image of the reticle R is projection-exposed on the exposure shot areas ESi. Subsequently, the value of the variable i is incremented by 1 in step 210. The operation shifts from step 211 again to step 207, wherein the exposure on the next exposure shot area is effected. The variable i reaches (N+1) in step 211. Namely, when finishing the exposures on all the exposure shot areas, the operation shifts to step 212, and the exposing process on the next wafer will be conducted.

As discussed above, in accordance with this embodiment, the virtual sample shot areas are disposed outwardly of the wafer W, and the virtual alignment data of the virtual sample shot areas are estimated from the actual alignment data. Then, the alignment is implemented based on the weighted EGA method by employing the alignment data of these actual and virtual sample shot areas. Hence, even when aligning the exposure shot area on the periphery of the wafer W, there are effectively availed the alignment data of almost the same number of sample shot areas as that of the exposure shot areas existing substantially in the vicinity of the center of the wafer W. An alignment accuracy (a superposition accuracy) at the peripheral portion of the wafer W is enhanced. Besides, the number of the sample shot areas actually undergoing the coordinate measurement is substantially the same as in the case of effecting the alignment by the ordinary EGA method. An arithmetic time is taken enough to be ignorable as compared with the measuring time, and, therefore, a throughput of the exposure step does not decrease.

Note that only the array error of the virtual sample shot area is obtained from the approximate function in this embodiment, however, the following operation may also be performed. The array errors in the respective positions of all the exposure shot areas on the wafer are obtained from the approximate functions of the alignment data of the sample shot areas SA1–SA13. The respective exposure shot areas ESi may be aligned based on the weighted EGA method by employing the those approximate functions and the array errors of the virtual sample shot areas. That is, all the exposure shot areas on the wafer W also become the virtual sample shot areas, and the enhancement of the locating accuracy can be expected all the more. However, the sample shot areas lack in terms of their number mainly on the periphery of the wafer W. Therefore, the areas where the array errors are obtained are only the exposure shot areas along the peripheral portion of the wafer W. The respective exposure shot areas ESi may be aligned based on the weighted EGA method by using the array errors of these exposure shot areas and virtual sample shot areas.

Figure 16:
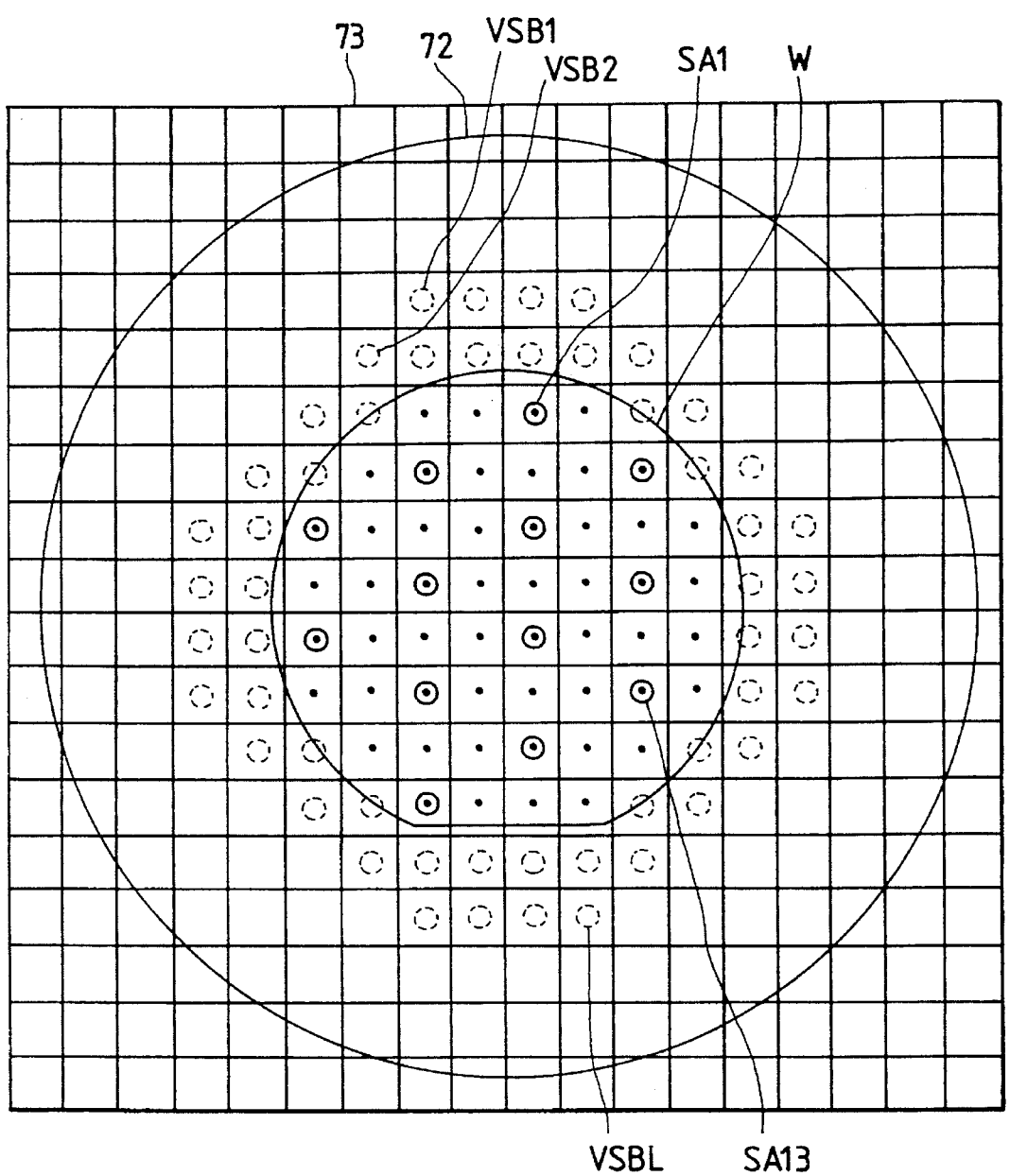
FIG. 16 is a diagram showing another example of the layout of the virtual sample shot areas.

Further, there may be adopted an array where sample shot areas VSB1, VSB2, . . . , VSBL are, as shown in, e.g., FIG. 16, clustered close together only in the zone in proximity to the wafer W. Further, the virtual sample shot areas are not necessarily disposed outwardly of the wafer W. There may be set, as virtual sample shot areas, the exposure shot areas existing particularly along the periphery of the wafer among the ordinary exposure shot areas (and the exposure shot areas exclusive of the sample shot areas) on the wafer W. If effective in use for calculating the coordinate positions of the exposure shot areas existing along the periphery of the wafer, the exposure shot areas existing within the predetermined zone at the center of the wafer may be set virtual sample shot areas.

By the way, the locating accuracy of the exposure shot areas existing especially along the periphery may be enhanced by the following method without forming the virtual exposure shot area map and the virtual sample shot areas as in the present embodiment.

That is, the coordinate positions of all the exposure shot areas are calculated by applying the weighted EGA method with respect to the exposure shot areas existing along the periphery of the wafer. Obtained is an approximate function of the array error in a predetermined direction (e.g., a direction of passing through the wafer center, a direction in which the sample shot areas are arranged on the straight line, and so forth) by use of the thus calculated coordinate positions. Then, the array error of each exposure shot area is obtained from this approximate function. The alignment and the exposure are conducted in accordance with this array error. Further, the exposure shot areas disposed over the entire surface of the wafer W may be located by this method.

Herein, obtaining the approximate function of the array error of each exposure shot area on the wafer may involve the use of the measured result itself of the position of the sample shot area. In addition, the weight when obtaining the design coordinate position of each exposure shot area by the weighted EGA method may be changed according to the position of the exposure shot area. Moreover, the approximate function of the array error may be obtained after applying a predetermined weight to the measured result of the position of each sample shot area.

Further, a size of the above-mentioned zone (where the sample shot areas effective in use for calculating the coordinate positions) is increased based on a predetermined rule according as the position of the exposure shot area approaches the periphery of the wafer. The sample shot areas which lack at the peripheral portion of the wafer may be thereby supplemented. This implies that the zone for taking a sum of weighted remainders is, when the residual error component Ei relative to each exposure shot area ESi is expressed by the formula (7), confined to only the actual sample shot areas (SA1–SA13 in FIG. 11), and the value of the parameter S for determining the weight Win in the formula (12) becomes larger as it approaches the periphery of the wafer.

Next, the alignment method in a third embodiment of the present invention will be described with reference to FIG. 17. In this embodiment, the wafer W of FIG. 18 is loaded on the wafer stage WS. FIG. 18 illustrates an array of the exposure shot areas on the wafer W. Basically, the configuration thereof is the same as the wafers shown in FIGS. 5A and 11, and hence the explanation will be omitted.

Figure 17:
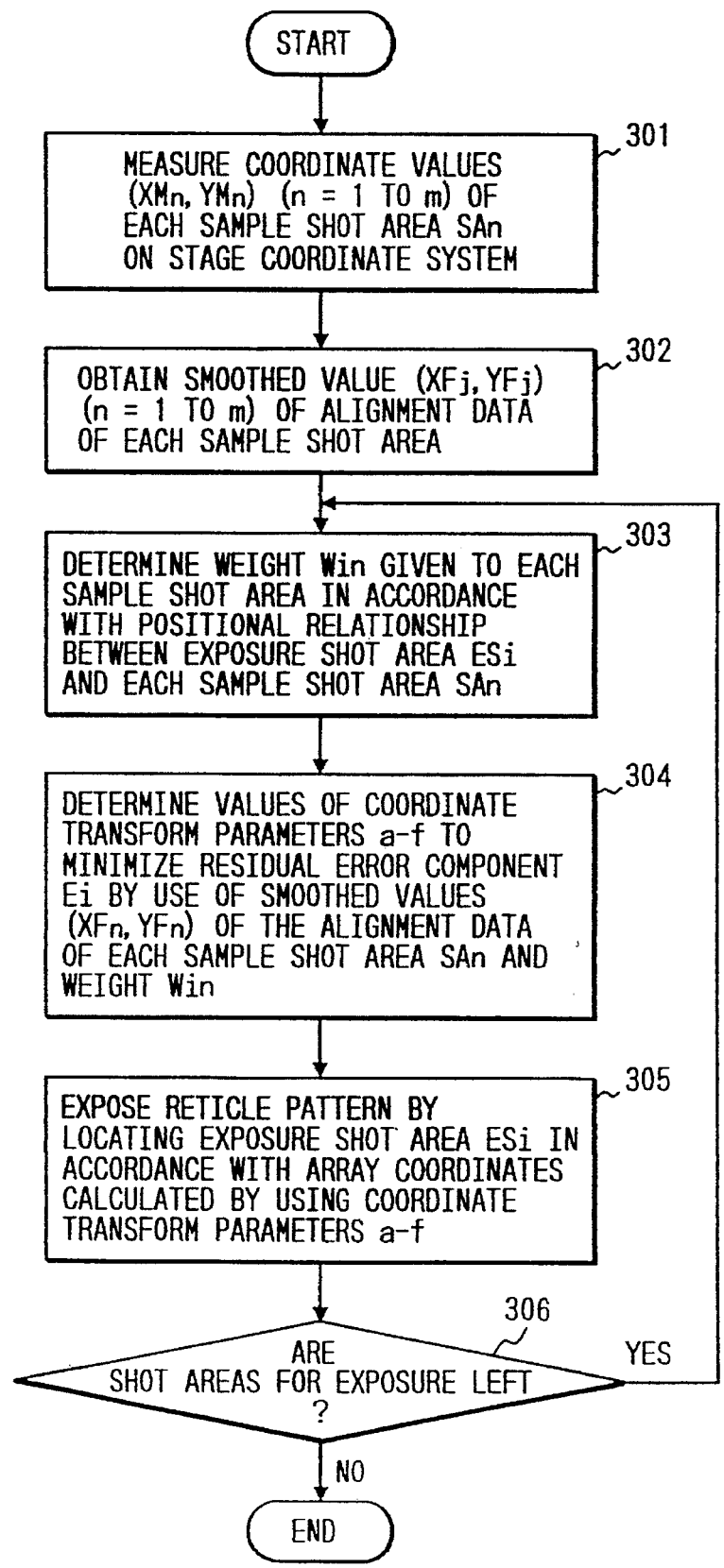
FIG. 17 is a flowchart showing an alignment method in accordance with a third embodiment of this invention.
Figure 18:
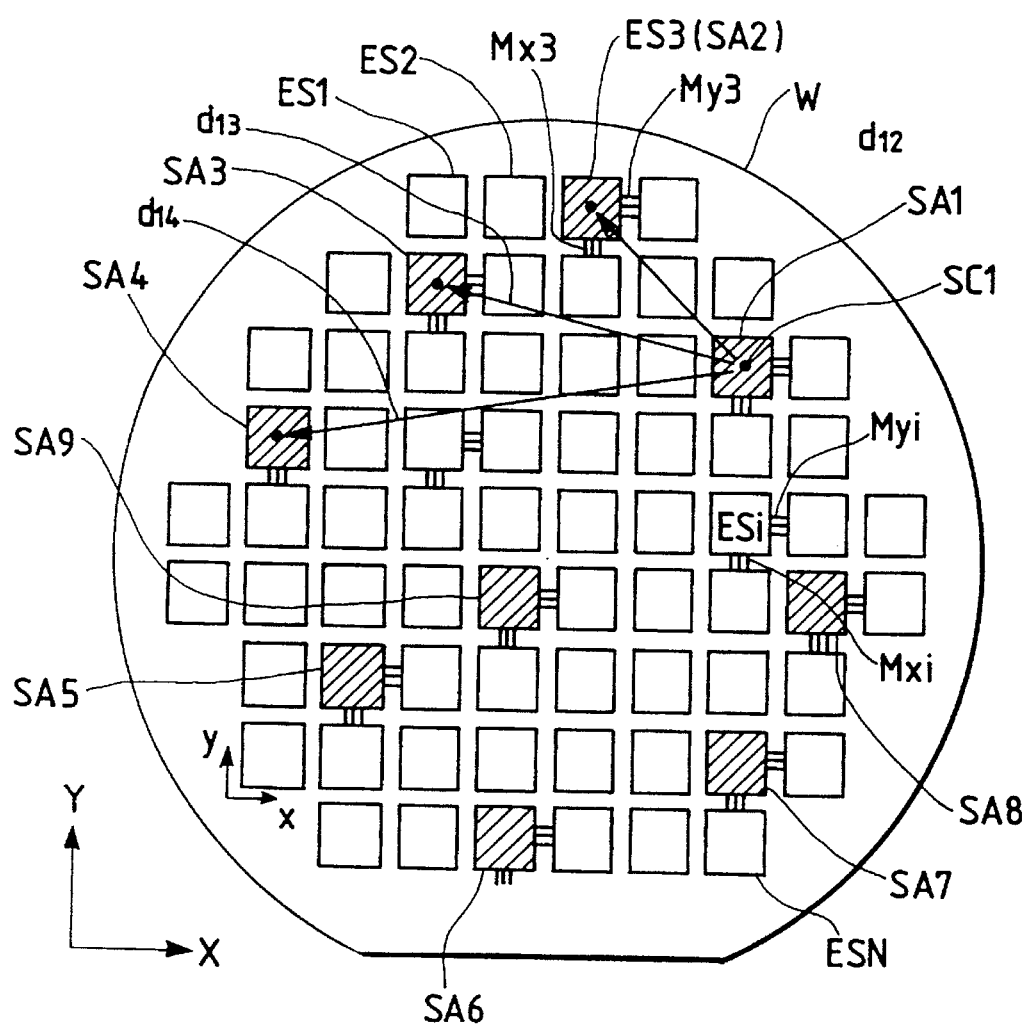
FIG. 18 is a diagram illustrating a layout of the sample shot areas on the wafer employed in the third embodiment.

Now, in step 301 of FIG. 17, there is measured a coordinate position, on the stage coordinate system XY, of each of nine sample shot areas SA1–SA9 selected from all the exposure shot areas ES1–ESN on the wafer W by use of the FIA system absolutely in the same way with the first and second embodiments. This measured coordinate position is supplied to the EGA arithmetic unit 59 via the memory unit 61.

Next, in step 302, the EGA arithmetic unit 62 smooths alignment data $(XM_j, YM_j)$ of the respective sample shot areas SAj (j=1 to m) and thus calculates coordinate positions $(XF_j, YF_j)$. In this embodiment, when obtaining the smoothed coordinate position of the jth sample shot area SAj, let $d_{jn}$ be the distance from the jth sample shot area SAj to the nth sample shot area SAn (n=1 to m), and there is introduced such a weighting function $V(d_{jn})$ as to give a larger weight to the alignment data of the sample shot area having a smaller distance $d_{jn}$.

Paying attention to FIG. 18, for instance, distances $d_{12}$–$d_{14}$ from the sample shot area SA1 to the respective sample shot areas SA2–SA4 are distances from a center SC1 of the sample shot area SA1 to respective centers of the sample shot areas SA2–SA4, wherein a relationship such as $d_{12} < d_{13} < d_{14}$ is established. Accordingly, when obtaining the smoothed coordinate position of the sample shot area SA1, a larger weight is given to the alignment data of the sample shot area SA2 than the alignment data of the sample shot area SA4. This is generalized, and an X-directional smoothed coordinate position $XF_j$ of the jth sample shot area SAj and a Y-directional coordinate position $YF_j$ thereof are calculated from the following formula:

$$XF_j = \sum_{n=1}^{m} \frac{V(d_{jn})}{V_j} XM_n, \quad YF_j = \sum_{n=1}^{m} \frac{V(d_{jn})}{V_j} YM_n \tag{13}$$

In the formula (13), the constant $V_j$ is defined by:

$$V_j = \sum_{n=1}^{m} V(d_{jn}) \tag{14}$$

Further, the weighting function $V(d_{jn})$ is defined as follows by using a predetermined parameter t by way of one example.

$$V(d_{jn}) = \frac{1}{\sqrt{2\pi t}} = \exp\{-d_{jn}^2/(2t)\} \tag{15}$$

In the formula (15), the distance $d_{jn}$ is calculated from the following formula by using the alignment data of each sample shot area:

$$d_{jn} = \sqrt{(XM_j - XM_n)^2 + (YM_j - YM_n)^2} \tag{16}$$

From the formulae (15) and (16), the maximum value of the weighting function $V(d_{jn})$ is given by $V(d_{jn})=V(0)=1/(2\pi t)^{1/2}$. The largest weight is applied to the alignment data of the sample shot area SAj itself.

In this case, a degree of smoothing can be changed by varying the value of the parameter t in the weighting function $V(d_{jn})$. Specifically, when increasing the value of the parameter t, even the alignment data of the sample shot area spaced away from the sample shot area SAj is considered broadly, and the degree of smoothing increases. If smoothed too much, however, there exists a possibility in which the non-linear error component is set too smaller than a true value.

Reversely, when decreasing the value of the parameter t, it follows that only the alignment data of the sample shot area close to the sample shot SAj is considered. A result corresponding to the non-linear error component in each position on the wafer W is obtained. However, the degree of smoothing is reduced. Accordingly, an optimum value of the parameter t may be varied in accordance with a measurement reproducibility of the alignment sensor and a measurement reproducibility per sample shot area. Further, if the measurement reproducibilities of the X- and Y-directional alignment sensors are different from each other, the value of the parameter t may be independently set in the X-direction and in the Y-direction, respectively.

Note that the weighting function employed for the smoothing process is not limited to $V(d_{jn})$ in the formula (15) but may be a weighting function used for the smoothing process by a typical statistical method. Further, the smoothing method is not confined to the above method but may be a generally availed method. Concretely, there may be obtained a smoothed value of the alignment data of the sample shot area SAj from each item of alignment data about the jth sample shot area SAj and the sample shot areas disposed along the periphery thereof by use of the functional approximation of a predetermined order.

Thereafter, the alignment is performed based on the weighted EGA method by employing the smoothed coordinate positions $(XF_n, YF_n)$ of the alignment data of the sample shot areas SAn (n=1 to m). That is, the EGA arithmetic unit 62 determines the weight Win given to each sample shot area SAn in step 303 in accordance with a positional relationship between the exposure shot area ESi and each sample shot area SAn on the assumption that the ith exposure shot area ESi is exposed.

Figure 19:
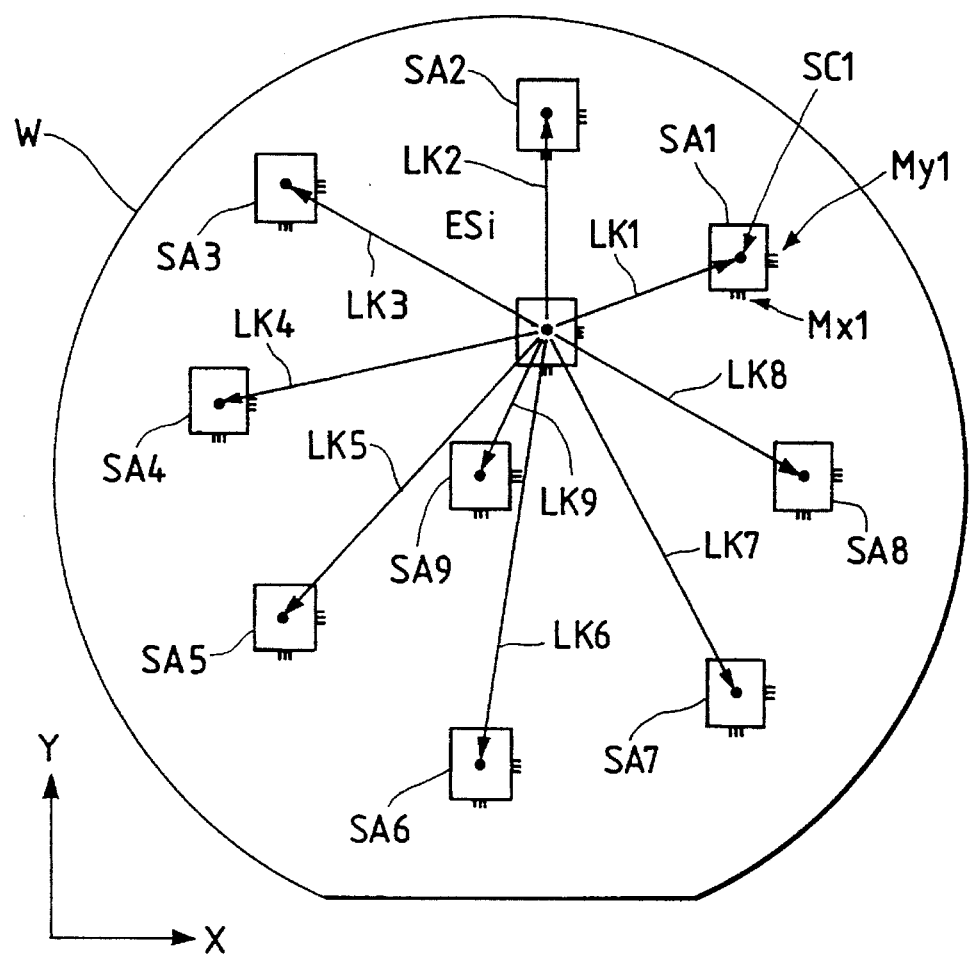
FIG. 19 is a diagram of assistance in explaining one example of a method of determining a weight by a weighted EGA method.

One example will be given hereinbelow. As illustrated in FIG. 19, let LKn be the distance from the exposure shot area ESi to the nth sample shot area SAn (n=1 to m, but m=9 in FIG. 19), and the weight Win given to the sample shot SAn is determined from the formula (12). Note that the value of the parameter S is set from the above formula (4) or (5).

Next, in step 304, the residual error component Ei relative to the exposure shot area ESi is expressed by the following formula. This involves the use of the smoothed coordinate value $(XF_n, YF_n)$ of the sample shot area SAn (n=1 to m) obtained in step 302, the coordinate position $(x_n, Y_n)$ obtained by substituting the design coordinate position of the sample shot area SAn into the formula (1) and the weight Win determined from the formula (12) in step 303.

$$Ei = \sum_{n=1}^{M} W_{in}\{(X_n - XF_n)^2 + (Y_n - YF_n)^2\} \tag{17}$$

Then, the transform parameters a–f in the formula (1) are obtained to minimize this residual error component Ei. Next, in step 305, the EGA arithmetic unit 62 substitutes, into the formula (1), the design coordinate positions of the exposure shot areas ESi and the transform parameters a–f obtained in step 304. The coordinate positions of the exposure shot areas ESi are thus calculated. The thus calculated coordinate positions of the exposure shot areas ESi are supplied to the system controller 65. Then, the system controller 65 locates the wafer stage WS according to the coordinate position obtained by adding a baseline quantity to the coordinate position calculated by the EGA arithmetic unit 62. The pattern image of the reticle R is exposed on the exposure shot area ESi.

In step 306, if there remain the shot areas on which the reticle patterns are to be exposed, the operation returns to step 303, the exposure shot areas are aligned and exposed. With the operations described above, the pattern image of the reticle R is sequentially exposed on each of all the exposure shot areas ES1–ESN on the wafer W of FIG. 18.

In this embodiment, the alignment data employed for the weighted EGA method involve the use of the smoothed coordinate values of the alignment data of the sample shot areas. Hence, the measurement errors of the alignment sensor are averaged down to the small ones. Accordingly, even if there is a large scatter in terms of the measured result of the alignment sensor (a bad measurement reproducibility), a good alignment accuracy is obtained.

Figure 20:
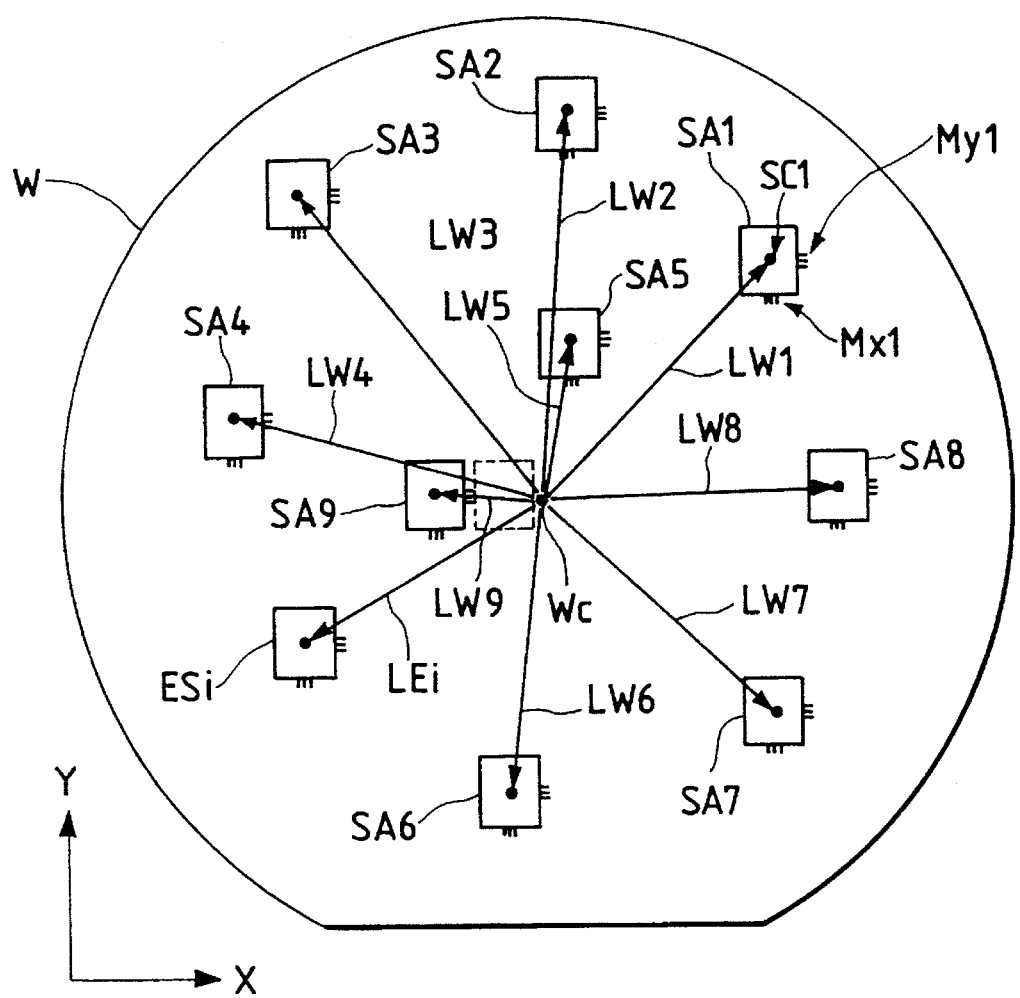
FIG. 20 is a diagram of assistance in explaining another example of the method of determining the weight by the weighted EGA method.

Note that the weight Win is determined based on the formula (12) in step 303 in accordance with this embodiment, however, a weight $W_{in}'$ obtained by the following calculation formula according to the parameter S may also be used. In this case, as illustrated in FIG. 20, the variant central point (e.g., a center of point symmetry of the non-linear distortion) of the wafer W is assumed as a wafer center Wc. Let LEi be the distance (radius) between the exposure shot area ESi and the wafer center Wc, and let LW1–LWm be the distances (radii) between the wafer center Wc and m-pieces (m=9 in FIG. 20) of respective sample shot areas SA1–SAm. The weight Win' defined by the following formula is given to the sample shot areas SAn in accordance with the distance LEi and the distances LW1–LWm.

$$W_{in}' = \frac{1}{\sqrt{2\pi S}} \exp\{-(LEi - LWn)^2/(2S)\} \quad (18)$$

Then, a residual error component Ei' in place of the residual error component Ei in step 304 is defined in the following formula by using this weight $W_{in}'$. The transform parameters a–f in the formula (1) are determined to minimize this residual error component Ei'. Other operations are the same as those of FIG. 17.

$$Ei' = \sum_{n=1}^{m} W_{in}'\{(X_n - XF_n)^2 + (Y_n - YF_n)^2\} \quad (19)$$

Figure 21:
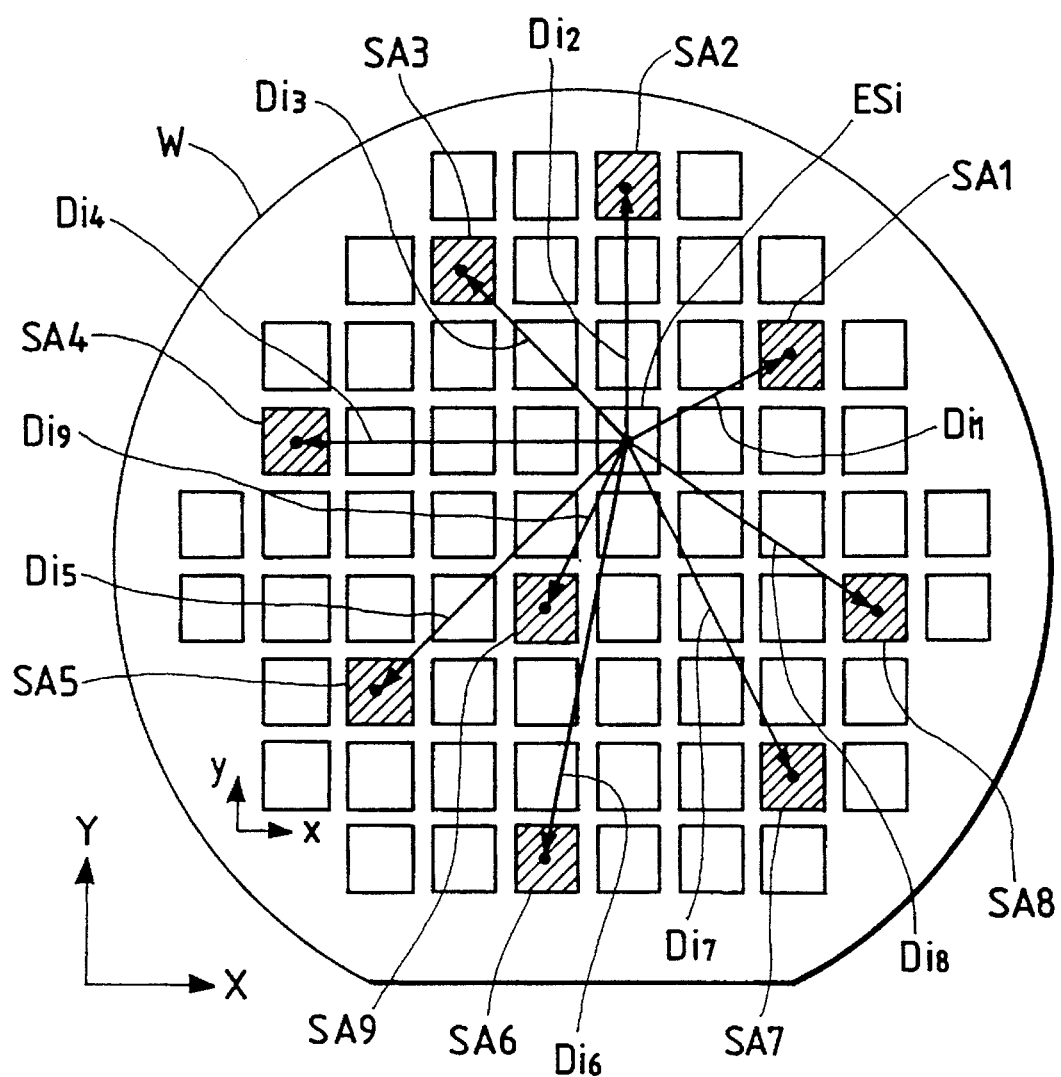
FIG. 21 is a diagram of assistance in explaining a method of calculating coordinate positions of the shot areas on the wafer employed in a fourth embodiment of this invention.
Figure 22:
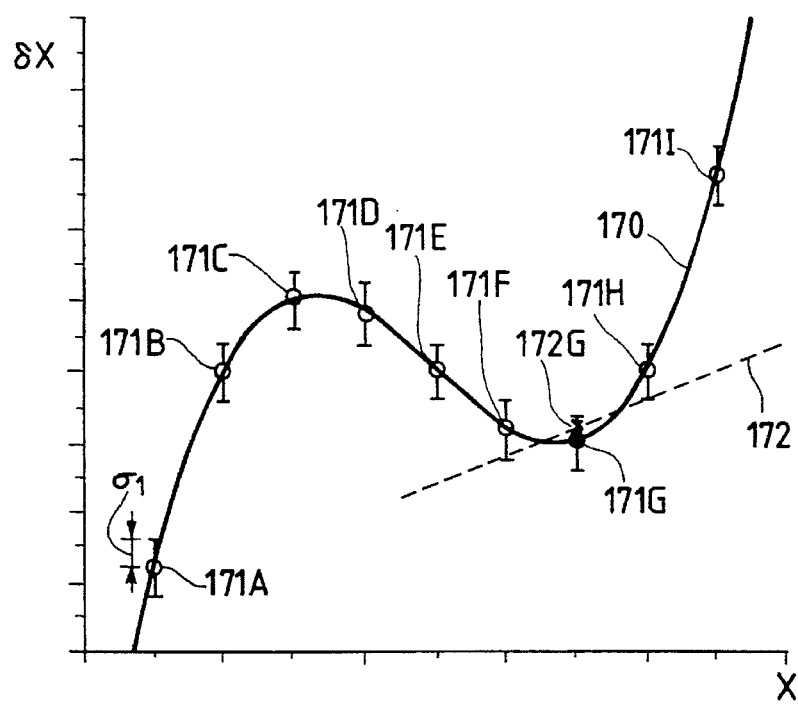
FIG. 22 is a diagram showing results of measuring the coordinate positions of the sample shot areas when an alignment sensor exhibits a good measurement reproducibility.
Figure 23:
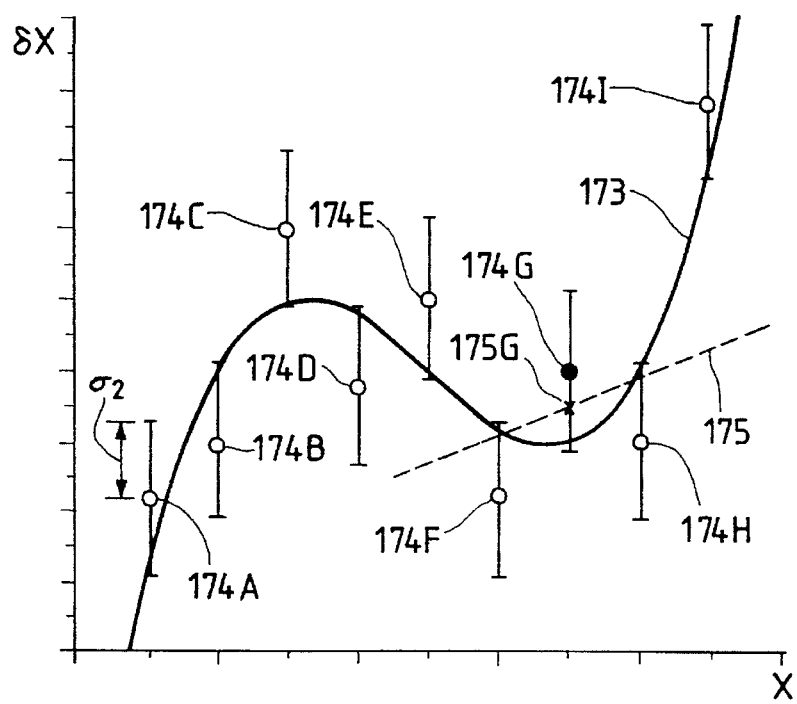
FIG. 23 is a diagram showing results of measuring the coordinate positions of the sample shot areas when the alignment sensor exhibits a bad measurement reproducibility.

Next, the alignment method in accordance with a fourth embodiment of this invention will be discussed with reference to FIG. 21. This embodiment will deal with only a difference from the third embodiment discussed above.

Now, in this embodiment, there are measured coordinate positions $(XM_n, YM_n)$, on the stage coordinate system XY, of nine sample shot areas SAn (n=1 through 9) selected from the N-pieces of exposure shot areas ES1–ESN on the wafer W by using the FIA system as in the third embodiment (step 301 of FIG. 17). Herein, the alignment data of the sample shot areas SA1–SA9 are smoothed on the assumption that the ith exposure shot area ESi on the wafer shown in FIG. 21 is to be aligned. A coordinate position $(xf_i, yf_i)$ of the exposure shot area ESi is thereby calculated. For performing this smoothing process, let $D_{in}$ be the distance between the center of the exposure shot area ESi and the center of the sample shot area SAn. A weighting function $V(D_{in})$ is defined by substituting the distance $D_{in}$ instead of the distance $d_{in}$ in the formula (15). A coordinate position calculated from the sample shot areas SA1–SA9 by employing the EGA method are usable as the coordinate position of the exposure shot area ESi when obtaining the distance $D_{in}$.

Next, the alignment data $(XM_n, YM_n)$ of the sample shot area are smoothed by the following formula, and the X- and Y-directional coordinate positions $df_i, yf_1$ of the exposure shot area ESi are thereby obtained.

$$xf_i = \sum_{n=1}^{m} \frac{V(D_{in})}{V_i} XM_n, \quad yf_i = \sum_{n=1}^{m} \frac{V(D_{in})}{V_i} YM_n \quad (20)$$

However, $V_i = \sum_{n=1}^{m} V(D_{in})$

Furthermore, the wafer stage WS is located according to the coordinate positions $(xf_i, yf_i)$ obtained by the above smoothing process (the weighted averaging process in this embodiment). The pattern image of the reticle R is then exposed on the exposure shot area. Hereinafter, m-items of alignment data are smoothed per exposure shot area, thereby obtaining the X- and Y-directional coordinate positions. Thus, the pattern image of the reticle R is sequentially exposed on each of the N-pieces of exposure shot areas ES1–ESN.

Incidentally, each exposure shot area ESi is not located by using the coordinate positions $(xf_i, Yf_i)$ obtained by the above smoothing process (the formula (20)) as they are. Instead, the coordinate position of each exposure shot area ESi may be calculated by the weighted EGA method, wherein the coordinate positions $(xf_i, Yf_i)$ undergoing the smoothing process are set as the alignment data of the sample shot, and all of or a part of the N-pieces of the exposure shot areas ES1–ESN are regarded as the sample shot areas. In this case also, it is possible to perform such an alignment that the non-linear distortion quantity of each shot area is accurately corrected.

By the way, in accordance with this embodiment, a true non-linear error quantity is obtained by reducing only the measurement error contained in each item of alignment data with the smoothing process. For this purpose, the condition becomes better with a larger number of items of the data (the number of sample shot areas). Further, the coordinate position may be acquired by detecting a plurality (e.g., four pieces) of wafer marks within the sample shot area in order to increase the number of items of the data. The processing on this occasion is not that all the coordinate positions of the plurality of wafer marks in each of all the sample shot areas are measured but that a part of the wafer marks are thinned out per sample shot area, and the coordinate positions thereof may be measured. Furthermore, as stated in the second embodiment, at least one virtual sample shot area is set, and the number of items of the data may be increased by using each coordinate position of the estimated virtual sample shot area absolutely in the same way as the above-mentioned.

It is apparent that, in this invention, a wide range of different working modes can be formed based on the invention without deviating from the spirit and scope of the invention. This invention is not restricted by its specific working modes except being limited by the appended claims.

What is claimed is:

1. A method of aligning each of a plurality of processing areas on each of a plurality of substrates with a predetermined position in a static coordinate system for defining movement of the substrates, comprising:

obtaining a state of distortion of a K-th substrate, where K is an integer;

weighting respective coordinate positions of a group of specified areas selected from a plurality of processing areas on said K-th substrate in accordance with the state of distortion of the K-th substrate;

aligning each of the plurality of processing areas on said K-th substrate with said predetermined position;

obtaining a state of distortion of a (K+N)-th substrate, where N is an integer;

examining a correlation between the state of distortion of said K-th substrate and the state of distortion of said (K+N)-th substrate;

weighting, if the correlation is high, each of respective coordinate positions of a group of specified areas selected from a plurality of processing areas on said (K+N)-th substrate the same as corresponding coordinate positions of the group of specified areas of the K-th substrate; and aligning each of the plurality of processing areas on said (K+N)-th substrate with said predetermined position.

2. A method according to claim 1, further comprising:

obtaining, if the correlation is high, a relative rotational deviation between the state of distortion of said K-th substrate and that of said (K+N)-th substrate; and weighting each of the coordinate positions of the group of specified areas selected from said plurality of processing areas on said (K+N)-th substrate based on the rotational deviation.

3. A method of aligning each of a plurality of processing areas on a substrate with a predetermined position in a static coordinate system for defining movement of said substrate, comprising:

obtaining a non-linear error in at least a part of said plurality of processing areas;

measuring a coordinate position, in said static coordinate system, of each of a group of specified areas selected from said plurality of processing areas;

weighting the coordinate positions of each of said group of specified areas based on the obtained non-linear error and performing a statistical calculation using the weighted coordinate positions to obtain a calculated coordinate position, in said static coordinate system, of each of said plurality of processing areas on said substrate; and aligning each of said plurality of processing areas with said predetermined position based on the corresponding calculated coordinate position.

4. A method of aligning each of a plurality of processing areas on a substrate with a predetermined position in a static coordinate system for defining a moving position of the substrate, said method comprising:

measuring a coordinate position, in the static coordinate system, of each of a group of specified areas selected from said plurality of processing areas;

adding at least one virtual specified area outwardly of said substrate or inwardly of said substrate that is not in said group of specified areas;

estimating a coordinate position, in the static coordinate system, of said virtual specified area based on the measured coordinate positions;

obtaining a calculated coordinate position, in the static coordinate system, of each of said plurality of processing areas on said substrate by performing a statistical calculation using said measured coordinate positions and said estimated coordinate position; and aligning each of said plurality of processing areas with said predetermined position based on the corresponding calculated coordinate position.

5. A method of aligning each of a plurality of processing areas on a substrate with a predetermined position in a static coordinate system for defining a moving position of the substrate, said method comprising:

measuring a coordinate position, in the static coordinate system, of each of a group of specified areas selected from said plurality of processing areas;

smoothing the coordinate position of each of said group of specified areas by weight-averaging each of the coordinate positions of said group of specified areas;

selecting one of said plurality of processing areas as an area to be aligned and weighting each of the smoothed coordinate positions in accordance with a positional relationship between the area to be aligned and each of said group of specified areas and performing a statistical calculation using said weighted coordinate positions to obtain a calculated coordinate position, in said static coordinate system, of said area to be aligned; and aligning said area to be aligned with said predetermined position based on the calculated coordinate position.

6. A method of aligning each of a plurality of processing areas on a substrate with a predetermined position in a static coordinate system for defining a moving position of the substrate, said method comprising:

measuring a coordinate position, in the static coordinate system, of each of a group of specified areas selected from said plurality of processing areas;

estimating a coordinate position, in said static coordinate system, of each of said plurality of processing areas on said substrate by weight-averaging the respective coordinate positions of said group of specified areas; and aligning each of said plurality of processing areas with said predetermined position based on the corresponding estimated coordinate position.

7. A method according to claim 4, further comprising:

exposing each of said plurality of processing areas aligned with said predetermined position with a pattern image of a mask.

8. A method according to claim 5, further comprising:

exposing said area aligned with said predetermined position with a pattern image of a mask.

9. A method according to claim 5, wherein said smoothing includes, when smoothing the coordinate position of one of said group of specified areas, weighting each of the coordinate positions of said group of specified areas based on the distance between the one specified area and each of the other specified areas and weight-averaging the weighted coordinate positions, thereby smoothing the coordinate position of said one specified area.

10. A method according to claim 5, wherein said smoothing includes, when smoothing the coordinate position of one of said group of specified areas, weighting each of the coordinate positions of said group of specified areas based on a positional relationship between said area to be aligned and each of said group of specified areas and weight-averaging the weighted coordinate positions, thereby smoothing the coordinate position of said one specified area.

11. A method according to claim 6, further comprising:

exposing each of said plurality of processing areas aligned with said predetermined position with a pattern image of a mask.

12. A method for aligning each of a plurality of processing areas on a substrate with a predetermined position in a static coordinate system for defining movement of said substrate, comprising:

obtaining a state of distortion of said substrate;

measuring a coordinate position, in said static coordinate system, of each of a group of specified areas selected from said plurality of processing areas;

for each of said plurality of processing areas on said substrate, weighting each of the measured coordinate positions of said group of specified areas in accordance with said state of distortion and performing a statistical calculation using the weighted coordinate positions to obtain a calculated coordinate position, in said static coordinate system, for each of said processing areas on said substrate; and aligning each of said plurality of processing areas with said predetermined position based on the corresponding calculated coordinate position.

13. A method according to claim 12, further comprising:

exposing each of said plurality of processing areas aligned with said predetermined position with a pattern image of a mask.

14. A method according to claim 12, wherein said obtaining includes obtaining a non-linear distortion of each of said plurality of processing areas on the substrate.

15. A method according to claim 12, wherein, when one of said plurality of processing areas on said substrate is selected as an area to be aligned, a measured coordinate position of a processing area in said group of specified areas having a state of distortion with a same tendency as said area to be aligned is weighted higher than a measured coordinate position of a processing area in said group of specified areas having a state of distortion with a different tendency from said area to be aligned.

16. A method according to claim 12, wherein, when one of said plurality of processing areas on the substrate is selected as an area to be aligned, each of the measured coordinate positions is weighted in accordance with a corresponding distance from the area to be aligned.

17. A method according to claim 12, wherein, when one of said plurality of processing areas on the substrate is selected as an area to be aligned, each of the measured coordinate positions is weighted in accordance with a corresponding distance from a center of said substrate.

18. A method according to claim 12, wherein said obtaining includes measuring a coordinate position for at least some of said plurality of processing areas on said substrate and obtaining the state of distortion based on the measured coordinate positions.

19. A method for aligning each of a plurality of processing areas on a substrate with a predetermined position in a static coordinate system for defining movement of said substrate, comprising:

measuring a coordinate position, in said static coordinate system, of each of a group of specified areas selected from said plurality of processing areas;

adding at least one virtual specified area differing from said plurality of processing areas on the substrate;

estimating a coordinate position, in said static coordinate system, of said virtual specified area based on the measured coordinate positions;

obtaining a coordinate position, in said static coordinate system, of each of said plurality of processing areas on said substrate based on the measured coordinate positions and the estimated coordinate position; and aligning each of said plurality of processing areas with said predetermined position based on the corresponding obtained coordinate position in said static coordinate system.

20. A method according to claim 19, further comprising:

exposing each of said plurality of processing areas aligned with said predetermined position with a pattern image of a mask.

21. A method according to claim 19, wherein said obtaining includes performing a statistical calculation using the measured coordinate positions and the estimated coordinate position to obtain a calculated coordinate position, in said static coordinate system, of each of said plurality of processing areas on said substrate.

22. A method according to claim 19, further comprising weighting, when one of said plurality of processing areas on said substrate is selected as an area to be aligned, each of the coordinate positions of said group of specified areas and the coordinate position of said virtual specified area in accordance with a corresponding distance from the area to be aligned.

23. A method according to claim 19, wherein said virtual specified area is added on a straight line passing through a center of said substrate.

24. A method according to claim 19, wherein said virtual specified area is added on a straight line passing through a plurality of areas in said group of specified areas.

* * * * *